(12) United States Patent
Tanaka

(10) Patent No.: US 7,872,246 B2
(45) Date of Patent: *Jan. 18, 2011

(54) LASER ANNEALING METHOD AND SEMICONDUCTOR DEVICE FABRICATING METHOD

(75) Inventor: Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 220 days.

This patent is subject to a terminal disclaimer.

(21) Appl. No.: 12/219,649

(22) Filed: Jul. 25, 2008

(65) Prior Publication Data

US 2009/0072162 A1   Mar. 19, 2009

Related U.S. Application Data

(62) Division of application No. 11/583,743, filed on Oct. 20, 2006, now Pat. No. 7,498,212, which is a division of application No. 10/021,719, filed on Dec. 19, 2001, now Pat. No. 7,160,764.

(30) Foreign Application Priority Data

Dec. 27, 2000 (JP) ............................. 2000-399462

(51) Int. Cl.
G21G 5/00 (2006.01)
(52) U.S. Cl. ............ 250/492.2; 250/492.1; 250/492.22; 438/106; 438/308; 438/378; 438/487; 219/121.75
(58) Field of Classification Search ............... 250/492.1, 250/492.2, 492.22; 438/106, 308, 378, 487; 219/121.75
See application file for complete search history.

(56) References Cited

U.S. PATENT DOCUMENTS 4,330,363 A   5/1982   Biegesen et al.

(Continued)

FOREIGN PATENT DOCUMENTS

EP   0 905 540   3/1999

(Continued)

OTHER PUBLICATIONS

Search Report of Aug. 27, 2004, Application No. 200107937-5.

(Continued)

*Primary Examiner*—Jack I Berman
*Assistant Examiner*—Michael Maskell
(74) *Attorney, Agent, or Firm*—Eric J. Robinson; Robinson Intellectual Property Law Office, P.C.

(57) ABSTRACT

When the second harmonic of a YAG laser is irradiated onto semiconductor films, concentric-circle patterns are observed on some of the semiconductor films. This phenomenon is due to the non-uniformity of the properties of the semiconductor films. If such semiconductor films are used to fabricate TFTs, the electrical characteristics of the TFTs will be adversely influenced. A concentric-circle pattern is formed by the interference between a reflected beam 1 reflected at a surface of a semiconductor film and a reflected beam 2 reflected at the back surface of a substrate. If the reflected beam 1 and the reflected beam 2 do not overlap each other, such interference does not occur. For this reason, a laser beam is obliquely irradiated onto the semiconductor film to solve the interference. The properties of a crystalline silicon film formed by this method are uniform, and TFTs which are fabricated by using such crystalline silicon film have good electrical characteristics.

42 Claims, 25 Drawing Sheets

U.S. PATENT DOCUMENTS

| | | | | |
|---|---|---|---|---|
| 5,521,107 | A | 5/1996 | Yamazaki et al. | |
| 5,561,081 | A | 10/1996 | Takenouchi et al. | |
| 5,591,668 | A | 1/1997 | Maegawa et al. | |
| 5,712,191 | A | 1/1998 | Nakajima et al. | |
| 5,854,803 | A | 12/1998 | Yamazaki et al. | |
| 5,937,282 | A | 8/1999 | Nakajima et al. | |
| 5,953,597 | A | 9/1999 | Kusumoto et al. | |
| 5,970,368 | A | 10/1999 | Sasaki et al. | |
| 6,002,523 | A | 12/1999 | Tanaka | |
| 6,013,928 | A | 1/2000 | Yamazaki et al. | |
| 6,137,633 | A | 10/2000 | Tanaka | |
| 6,159,777 | A | 12/2000 | Takenouchi et al. | |
| 6,160,827 | A * | 12/2000 | Tanaka | 372/24 |
| 6,204,099 | B1 | 3/2001 | Kusumoto et al. | |
| 6,210,996 | B1 | 4/2001 | Yamazaki et al. | |
| 6,242,289 | B1 | 6/2001 | Nakajima et al. | |
| 6,265,745 | B1 | 7/2001 | Kusumoto et al. | |
| 6,310,727 | B1 | 10/2001 | Tanaka | |
| 6,392,810 | B1 | 5/2002 | Tanaka | |
| 6,455,359 | B1 | 9/2002 | Yamazaki et al. | |
| 6,512,634 | B2 * | 1/2003 | Tanaka | 359/624 |
| 6,556,711 | B2 | 4/2003 | Koga et al. | |
| 6,602,744 | B1 | 8/2003 | Ino et al. | |
| 6,759,628 | B1 | 7/2004 | Ino et al. | |
| 6,844,249 | B2 | 1/2005 | Kawasaki et al. | |
| 6,849,825 | B2 * | 2/2005 | Tanaka | 219/121.82 |
| 7,132,375 | B2 | 11/2006 | Yamazaki | |
| 7,217,605 | B2 | 5/2007 | Kawasaki et al. | |
| 2003/0024905 | A1 | 2/2003 | Tanaka | |

FOREIGN PATENT DOCUMENTS

| | | | |
|---|---|---|---|
| EP | 1 003 207 | | 5/2000 |
| JP | 58-090723 | | 5/1983 |
| JP | 08-097141 | | 4/1996 |
| JP | 08-195357 | | 7/1996 |
| JP | 09-102468 | | 4/1997 |
| JP | 09-116160 | | 5/1997 |
| JP | 09-260681 | | 10/1997 |
| JP | 09-321311 | | 12/1997 |
| JP | 10-012891 | | 1/1998 |
| JP | 10-256152 | | 9/1998 |
| JP | 11-162868 | | 6/1999 |
| JP | 2000-058478 | | 2/2000 |
| JP | 2000-133593 | | 5/2000 |
| JP | 2000-269161 | | 9/2000 |
| JP | 2000269161 | * | 9/2000 |
| KR | 153834 | | 12/1998 |

OTHER PUBLICATIONS

Hara et al., "Ultra-High Performance Poly-Si TFTs on a Glass by a Stable Scanning CW Laser Lateral Crystallization," AM-LCD '01, pp. 227-230.

Takeuchi et al., "Performance of Poly-Si TFTs Fabricated by a Stable Scanning CW Laser Crystallization," AM-LCD '01, pp. 251-254.

Nakata et al., "Controlling the Position of the Grain Boundary in an Si Film Crystallized by Linearly Polarized Laser Beam," The Institute of Electronics, Information and Communication Engineers, vol. 100, No. 396, pp. 13-19, Oct. 26, 2000.

Nakata et al., "Controlling the Position of the Grain Boundary in an Si Film Crystallized by Linearly Polarized Laser Beam," Technical Report of IEICE, vol. 100, No. 396, pp. 13-19, Oct. 26, 2000.

* cited by examiner

LASER ANNEALING METHOD AND SEMICONDUCTOR DEVICE FABRICATING METHOD

BACKGROUND OF THE INVENTION

1. Field of the Invention

The present invention relates to a method of annealing a semiconductor film by using a laser beam (hereinafter referred to as laser annealing). The invention also relates to a semiconductor device fabricating method which includes the laser annealing method as one step. Incidentally, the term "semiconductor device" used herein generally denotes devices which can function by using semiconductor characteristics, and encompasses electrooptical devices such as liquid crystal display devices and luminescent devices as well as electronic equipment including the electrooptical devices as constituent parts.

2. Background Art

In recent years, a wide range of researches have been made as to the art of applying laser annealing to a semiconductor film formed on an insulating substrate such as a glass substrate to crystallize the semiconductor film or to improve the crystallinity thereof. Silicon is widely used for such a semiconductor film. In the present specification, means for crystallizing a semiconductor film by a laser beam to obtain a crystalline semiconductor film is referred to as laser crystallization.

As compared with synthetic quartz glass substrates which have heretofore widely been used, glass substrates have the advantages of being inexpensive and rich in workability and of facilitating fabrication of large-area substrates. This is the reason why a wide range of researches have been made. The reason why lasers are preferentially used for crystallization is that the melting points of glass substrates are low. Lasers can give high energy to semiconductor films without increasing the temperatures of substrates to a great extent. In addition, lasers are remarkably high in throughput compared to heating means using electric heating furnaces.

A crystalline semiconductor is made of multiple crystal grains, and is also called a polycrystalline semiconductor film. Since a crystalline semiconductor film formed by the application of laser annealing has high mobility, the crystalline silicon film is used to form thin film transistors (TFTs). The thin film transistors are widely used in a monolithic type of liquid crystal electrooptical device in which TFTs for pixel driving and TFTs for driver circuits are fabricated on one glass substrate.

A method of effecting laser annealing by forming a high power pulsed laser beam such as an excimer laser beam, by an optical system, into a laser beam which becomes a spot of several cm square or a linear shape of length 10 cm or more at an irradiation plane, and scanning the laser beam (or relatively moving a position irradiated with the laser beam with respect to an irradiation plane) has preferentially been used because the method is high in productivity and superior in industrial terms.

Particularly when a linear laser beam is used, high productivity can be realized because the entire irradiation plane can be irradiated with the linear laser beam by scanning in only directions perpendicular to the lengthwise direction of the linear laser beam, unlike the case where a spot-shaped laser beam is used which needs to be scanned in forward, rearward, rightward and leftward directions. The reason why the linear laser beam is scanned in the lengthwise direction is that the lengthwise direction is the direction of the most efficient scanning. Because of this high productivity, in the laser annealing method the use of a linear laser beam into which a pulse oscillation excimer laser beam is formed by an appropriate optical system is presently becoming one of leading manufacturing techniques for semiconductor devices which are represented by liquid crystal devices using TFTs.

Although there are various kinds of lasers, it is general practice to use laser crystallization due to a laser beam which uses a pulse oscillation type of excimer laser as its light source (hereinafter referred to as an excimer laser beam). The excimer laser has high power and hence the advantage of enabling irradiation repeated at high frequencies, and further has the advantage of exhibiting a high absorption coefficient against silicon film.

To form the excimer laser beam, KrF (of wavelength 248 nm) and XeCl (of wavelength 308 nm) are used as exciting gases. However, gases such as Kr (krypton) and Xe (xenon) are very expensive and encounter the problem that as the frequency of gas replacement becomes higher, a greater increase in manufacturing cost is incurred.

Attachments such as a laser tube for effecting laser oscillation and a gas purifier for removing unnecessary compounds generated in an oscillation process need to be replaced every two or three years. Many of these attachments are expensive, resulting in a similar problem of an increase in manufacturing cost.

As described above, a laser irradiation apparatus using an excimer laser beam surely has high performance, but needs extremely complicated maintenance and also has the disadvantage that if the laser irradiation apparatus is used as a production-purpose laser irradiation apparatus, its running costs (which mean costs occurring during operation) become too high.

There is a method which uses a solid-state laser (a laser which outputs a laser beam by means of a crystal rod formed as a resonance cavity), to realize a laser irradiation apparatus which is low in running cost compared to excimer lasers as well as a laser annealing method using such a laser irradiation apparatus.

A semiconductor film was irradiated by using a YAG laser which was one of representative solid-state lasers. The output from the YAG laser was modulated into the second harmonic by a non-linear optical element, and the resulting laser beam (of wavelength 532 nm) was formed into a linear laser beam which became a linear shape at an irradiation plane. The semiconductor film was an amorphous silicon film of thickness 55 nm which was formed on a #1737 glass substrate made by Corning Incorporated, by a plasma CVD method. However, a concentric-circle pattern such as that shown in FIG. 2 was formed on the crystalline silicon film obtained by effecting laser annealing on the amorphous silicon film. This pattern indicates that the in-plane properties of the crystalline silicon film is non-uniform. Accordingly, if a TFT is fabricated from a crystalline silicon film on which a concentric-circle pattern is formed, the electrical characteristics of the TFT is adversely affected. Incidentally, in the present specification, a pattern such as that shown in FIG. 2 is called a concentric-circle pattern.

SUMMARY OF THE INVENTION

The invention generally provides a laser annealing method using a laser irradiation apparatus which is low in running cost compared to related arts, and specifically provides a laser annealing method which does not form or can reduce a concentric-circle pattern, as well as a semiconductor device fabricating method which includes the laser annealing method as one step.

First of all, consideration is given to a cause which forms a concentric-circle pattern such as that shown in FIG. 2. The laser beam irradiated onto the amorphous silicon film was a linear laser beam which became a linear shape at the irradiation plane. For this reason, even if any pattern is formed on the crystalline silicon film obtained after irradiation with the laser beam, the pattern should become a pattern parallel or perpendicular to the linear laser beam as long as the semiconductor film, the substrate and a substrate stage are completely flat. However, since the pattern observed in FIG. 2 has the shape of a concentric circle, it may be considered that the pattern is not due to the linear laser beam. In other words, it can be determined that the cause of the occurrence of the concentric-circle pattern lies in the distortion of any one or plural ones of the semiconductor film, the substrate and the substrate stage.

The concentric-circle pattern observed in FIG. 2 is similar to Newton's rings. Newton's rings are a fringe pattern which is formed when lights reflected from plural reflection surfaces interfere with one another. From this fact, it can be inferred that the concentric-circle pattern is similarly due to the interference of lights reflected from plural reflection surfaces. Experiments for identifying the plural reflection surfaces were performed.

FIGS. 3A and 3B respectively show the reflectivity and the transmissivity of an amorphous silicon film (of thickness 55 nm) against wavelengths. The amorphous silicon film is formed on the 1737 substrate by a plasma CVD method. It can be seen from FIGS. 3A and 3B that the reflectivity and the transmissivity are, respectively, 26% and 38% with respect to the second harmonic (of wavelength 532 nm) of the YAG laser. In other words, it can be considered that since the reflectivity and the transmissivity of the amorphous silicon film are high, an interference occurs between a beam reflected from the surface of the amorphous silicon film and a reflected beam which occurs when a laser beam transmitted through the amorphous silicon film is reflected at a certain surface.

The number of surfaces (reflection surfaces) at which the second harmonic of the YAG laser transmitted through the amorphous silicon film can be reflected can be considered to be three as follows:

(A) the substrate stage,
(B) the back surface of the substrate, and
(C) the interface between the amorphous silicon film and the substrate.

In order to identify which of these reflection surfaces is the cause of the concentric-circle pattern, the first and second experiments of eliminating the influence of each of the reflected beams were performed and a theoretical expression is obtained from the results of the first and second experiments. In each of the first and second experiments, a 55-nm-thick amorphous silicon film which was formed on a 1737 glass substrate 5 inches square and 0.7 mm thick was used as a semiconductor film. Incidentally, in the specification, the surface of the substrate is defined as a surface on which the film is deposited, while the back surface of the substrate is defined as a surface which is opposite to the surface on which the film is deposited.

First, the experiment of eliminating the influence of a beam reflected from a substrate stage 41 was performed as the first experiment. The first experiment will be described below with reference to FIG. 4. As shown in FIG. 4, a silicon wafer 43 was obliquely disposed between the substrate stage 41 and a substrate 10 on which a semiconductor film 11 was deposited, so that a beam reflected from the substrate stage 41 was prevented from interfering with a reflected beam 45 from a surface of the semiconductor film 11, and in this state, laser annealing was performed. The reference numeral 44 is an incident beam, and the reference numeral 46 is a reflected beam from a surface of the silicon wafer 43. In addition, a similar experiment was performed with the silicon wafer 43 omitted, in order to discriminate between a phenomenon due to the fact that the substrate stage 41 and the substrate 10 are not in contact with each other and a phenomenon due to the fact that the silicon wafer 43 is obliquely disposed between the substrate stage 41 and the substrate 10.

FIGS. 5A and 5B are views showing one example of the results of the first experiment. FIG. 5A shows different crystalline silicon films, one of which was obtained when laser annealing was performed with the silicon wafer 43 being obliquely disposed 4 cm apart from the substrate stage 41 and the other of which was obtained when laser annealing was performed with the silicon wafer 43 being not disposed. FIG. 5B is a schematic view of FIG. 5A. From FIGS. 5A and 5B, it can be seen that the concentric-circle patterns appear irrespective of the presence or absence of the silicon wafer 43. From this fact, it can be seen that the concentric-circle patterns are independent of the beam reflected from the substrate stage 41.

Then, the experiment of eliminating the influence of a beam reflected from the back surface of the substrate 10 was performed as the second experiment. The second experiment will be described below with reference to FIG. 6. As shown in FIG. 6, the substrate 10 was inclined with respect to an incident beam 64 so that a reflected beam 66 from the back surface of the substrate stage 41 and a reflected beam 65 from the surface of the semiconductor film 11 do not interfere with each other, and laser annealing was performed in this state. Incidentally, a support 42 was disposed on the substrate stage 41, and the substrate 10 was inclined in the state of being set against the support 42. The angle of the incident beam 64 was changed by changing the height of the support 42.

FIGS. 7A and 7B are views showing the result of the second experiment. FIG. 7A shows different crystalline silicon films which were respectively obtained when laser annealing was performed with supports 5 mm, 10 mm and 15 mm high being disposed, and FIG. 7B is a schematic view of FIG. 7A. From FIGS. 7A and 7B, it can be seen that a concentric-circle pattern was observed when one side of the substrate 10 was set against the support 5 mm high, whereas a concentric-circle pattern vanished when one side of the substrate 10 was set against the support 10 mm high. In other words, it is seen that if the incident laser beam is inclined at an angle, the concentric-circle pattern disappears when the angle of inclination is greater than or equal to a certain angle.

The interference between a beam reflected from the surface of the semiconductor film and a beam reflected from the interface of the semiconductor film and the substrate will be considered below with reference to FIG. 8. The amorphous silicon film is assumed to be a plain parallel plate having a refractive index n. A laser beam 84 incident on the amorphous silicon film at an angle $\theta_1$ is refracted and travels at an angle $\theta_2$ in the plain parallel plate. It is assumed here that the respective refractive indices of the amorphous silicon film and the substrate are 4 and 1.5 against the second harmonic (of wavelength 532 nm) of the YAG laser. Owing to the difference between both refractive indices, a phase deviation does not occur at the surface of the amorphous silicon film, but a relative phase deviation of $\pi$ occurs at the interface between the amorphous silicon film and the substrate. Taking this fact into account, a minimum condition for a reflected beam A 85 and a reflected beam B 86 is found as follows:

$$2nd \times \cos\theta_2 = m\lambda, (m \text{ is an integer}). \tag{1}$$

In Expression (1), λ represents the wavelength the incident beam, n represents the refractive index of the amorphous silicon film at the wavelength λ, and d represents the thickness of the amorphous silicon film. The following specific values are substituted into Expression (1):

n=4,
d=55 [nm], and
λ=532 [nm].

Substituting these values, the following expression is obtained:

$$\cos\theta_2 = m \times 532/(2 \times 4 \times 55) \quad (2)$$
$$= m \times 532/440.$$

From Expression (2), it is seen that since m can only take on θ, $\theta_2$ can only take on one value to minimize the interference between the reflected beam A 85 and the reflected beam B 86. From the fact that interference fringes occur in the case where m can take on plural values, it is seen that there is no possibility that a fringe pattern made of alternate dark and bright fringes is formed from the beam reflected at the interface between the amorphous silicon film and the substrate.

From the above-described experiment results and theoretical expression, it can be determined that the cause of the formation of the concentric-circle pattern is the interference between the beam reflected from the surface of the amorphous silicon film and the beam reflected from the back surface of the substrate. The cause that the concentric-circle pattern was formed can be considered to be that the substrate was warped not in only one direction but in two different directions. If the substrate is distorted in only one direction like a cylindrical lens, a concentric-circle pattern will not appear, and a parallel fringe pattern will be formed. FIGS. 10A and 10B are views showing the result obtained when the distortion of a 1737 glass substrate was measured after having been heat-treated at a temperature of 640° C. for five hours. In FIG. 10A, the horizontal axis represents the x direction, whereas in FIG. 10B, the horizontal axis represents the y direction, and the vertical axis of each FIGS. 10A and 10B represents distortion. The x direction and the y direction represented by the respective horizontal axes are determined for convenience's sake so that the substrate is positioned as shown in FIG. 9 with a cut called "orientation flat" being located on the top right of the substrate. From FIGS. 10A and 10B, it is apparent that the substrate is warped in both of the x and y directions. At present, this distortion may have an influence on laser annealing, but the extent of the distortion does not become a problem in any other step of fabricating semiconductor devices such as TFTs.

On the basis of the fact that, in the second experiment, no concentric-circle pattern appeared when laser annealing was performed with the substrate inclined, the invention provides the art of irradiating a laser beam onto a substrate at an angle. In accordance with the invention, it is possible to remove or reduce the non-uniformity of the properties of individual semiconductor films due to the interference of laser beams. By fabricating a TFT by using such a crystalline semiconductor film, it is possible to obtain a TFT having good electrical characteristics.

It is desirable that the laser beam used in the invention be irradiated in the state of being linearly formed by an optical system. Incidentally, linearly forming the laser beam means that the laser beam is formed so that it becomes linear in shape at an irradiation plane. In addition, the term "linear" used herein does not mean "a line" in the strict sense, and means a rectangle having a large aspect ratio (or an ellipse). For example, the term "linear" indicates a shape having an aspect ratio of 10 or more (preferably, 100-10,000).

The solid-state laser may use a generally known type of laser such as a YAG laser (ordinarily, an Nd:YAG laser), an Nd:YLF laser, an Nd:YVO$_4$ laser, an Nd:YAlO$_3$ laser, a ruby laser, an alexandrite laser or a Ti:sapphire laser. In particular, YVO$_4$ and YAG lasers which are superior in coherence and pulse energy are preferable.

However, the laser must be of a wavelength which can be transmitted through the semiconductor film, because the beam reflected from the back surface of the substrate interferes with the beam reflected at the surface of the semiconductor film. FIG. 3B shows the transmissivity of an amorphous silicon film of thickness 55 nm against wavelengths. From FIG. 3B, it is seen that the laser beam must have a wavelength of 350 nm or more (preferably, 400 nm or more) so that it can be transmitted through the amorphous silicon film of thickness 55 nm. However, in the invention, the material of the semiconductor film is not particularly limited, and not only silicon but a compound semiconductor film having an amorphous structure made of a silicon germanium (SiGe) alloy or the like may also be applied to the invention. The wavelength may be appropriately determined by an operator because wavelengths which can be transmitted through semiconductor films differ according to the kinds, the thicknesses or the like of individual semiconductor films.

For example, if the YAG laser is to be used, since the basic wave of the YAG laser has a long wavelength of 1064 nm, it is preferable to use the second harmonic (of wavelength 532 nm). The first harmonic can be modulated into the second harmonic, the third harmonic or the fourth harmonic by a wavelength modulator including non-linear elements. The formation of each of the harmonics may conform to known arts. Incidentally, it is herein assumed that a "laser beam which uses a solid-state laser as its light source" contains not only the first harmonic but other harmonics which are wavelength-modulated halfway on an optical path.

Otherwise, a Q-switching method (Q-modulation switching method) which is widely used in YAG-lasers may also be used. The Q-switching method is a method of outputting a pulsed laser having a very high energy level and steep pulse edges by keeping the Q of a laser resonator at a fully low value and suddenly increasing the Q to a high value. The Q-switching method is a known art.

Any of the solid-state lasers used in the invention is capable of outputting a laser beam by basically using a solid-state crystal, a resonance mirror and a light source for exciting the solid-state crystal, so that the solid-state lasers do not need extremely complicated maintenance unlike excimer lasers. In other words, the solid-state lasers are very low in running cost compared to excimer lasers, and make it possible to greatly reduce the manufacturing costs of semiconductor devices. In addition, as the number of times of maintenance cycles decreases, the operation rate of production lines increases, so that the overall throughput of manufacturing processes increases, thus greatly contributing to a reduction in the manufacturing costs of semiconductor devices. Moreover, since the areas occupied by the solid-state lasers are small compared to excimer lasers, the solid-state lasers are advantageous to designing of manufacturing lines.

BRIEF DESCRIPTION OF THE DRAWINGS

The invention will become more readily appreciated and understood from the following detailed description of preferred embodiments of the invention when taken in conjunction with the accompanying drawings, in which.

DETAILED DESCRIPTION OF THE INVENTION

Figure 1:
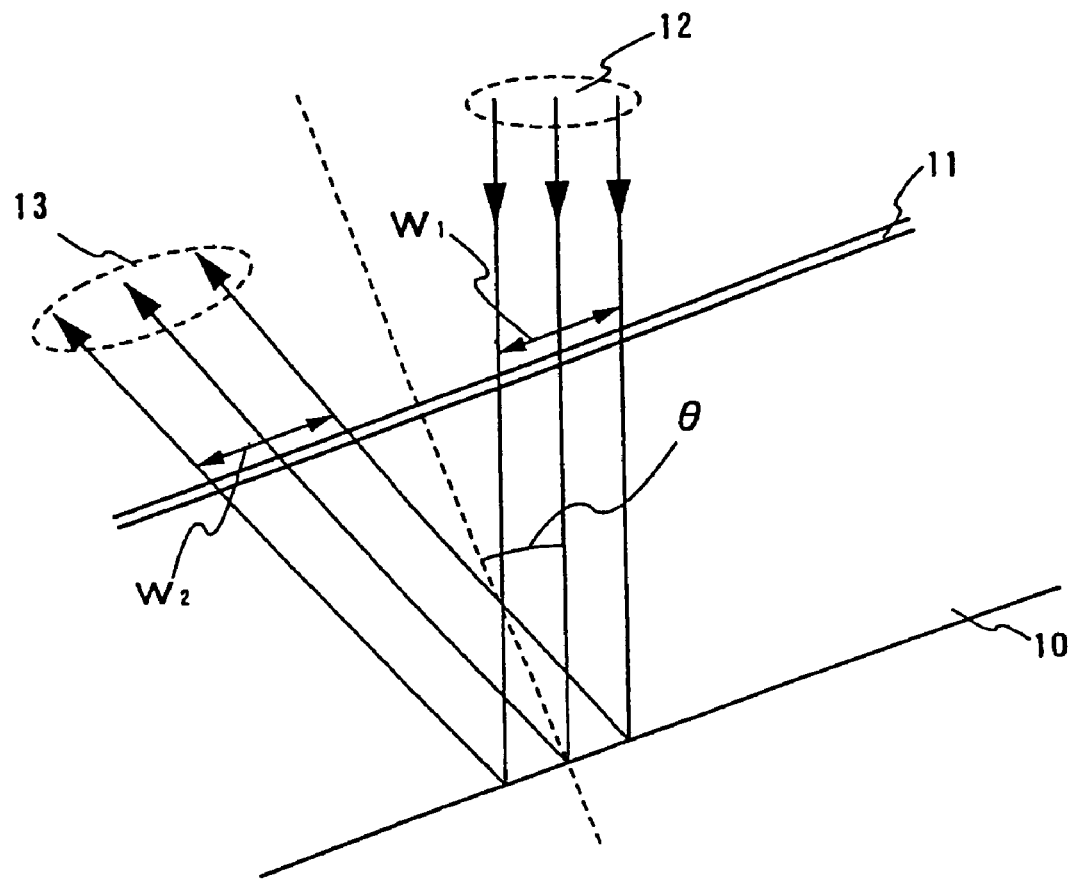
FIG. 1 is a view showing one example of the construction of a laser irradiation apparatus.
Figure 2:
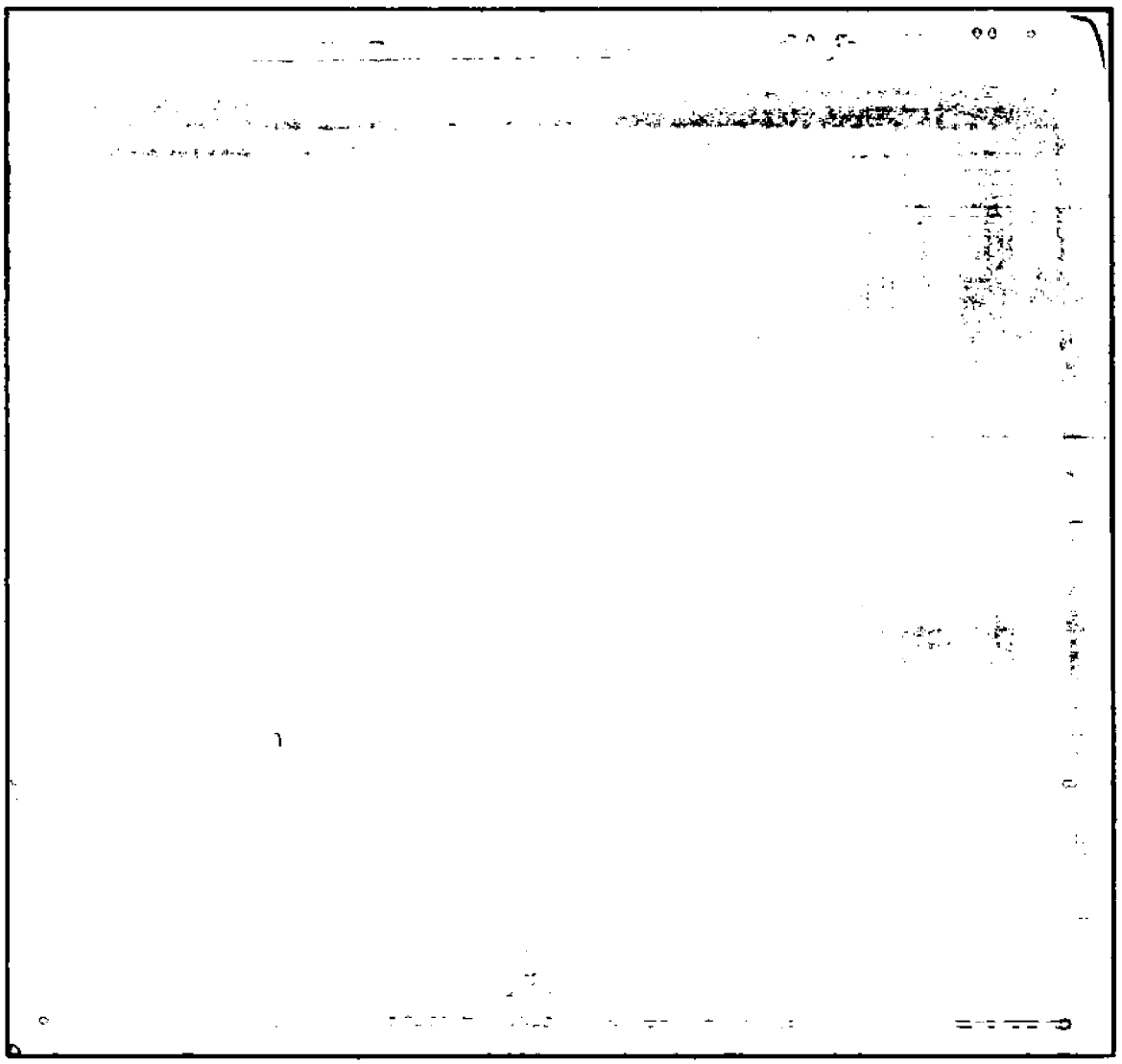
FIG. 2 is a view showing one example of a concentric-circle pattern.
Figure 3A:
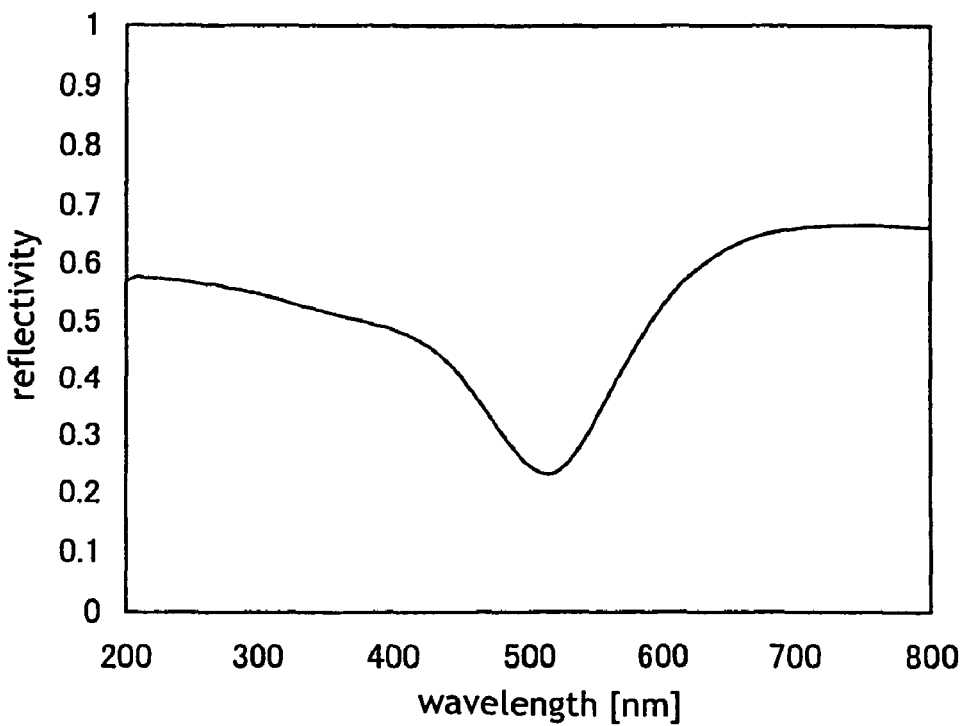
FIG. 3A is a view showing the reflectivity of an amorphous silicon film (of thickness 55 nm) against wavelengths.
Figure 3B:
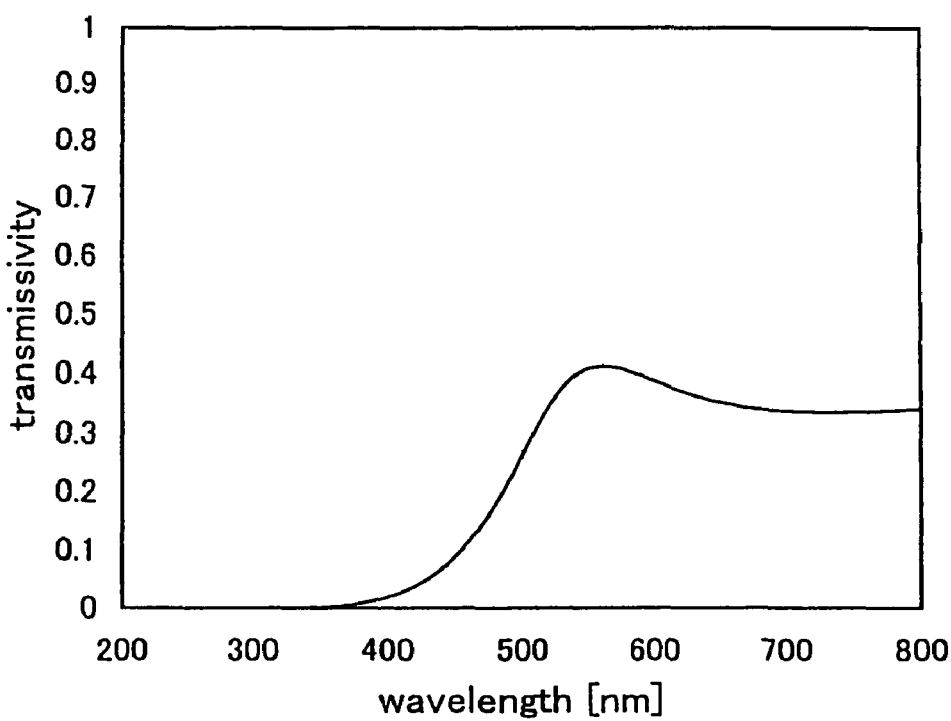
FIG. 3B is a view showing the transmissivity of the amorphous silicon film (of thickness 55 nm) against wavelengths.
Figure 4:
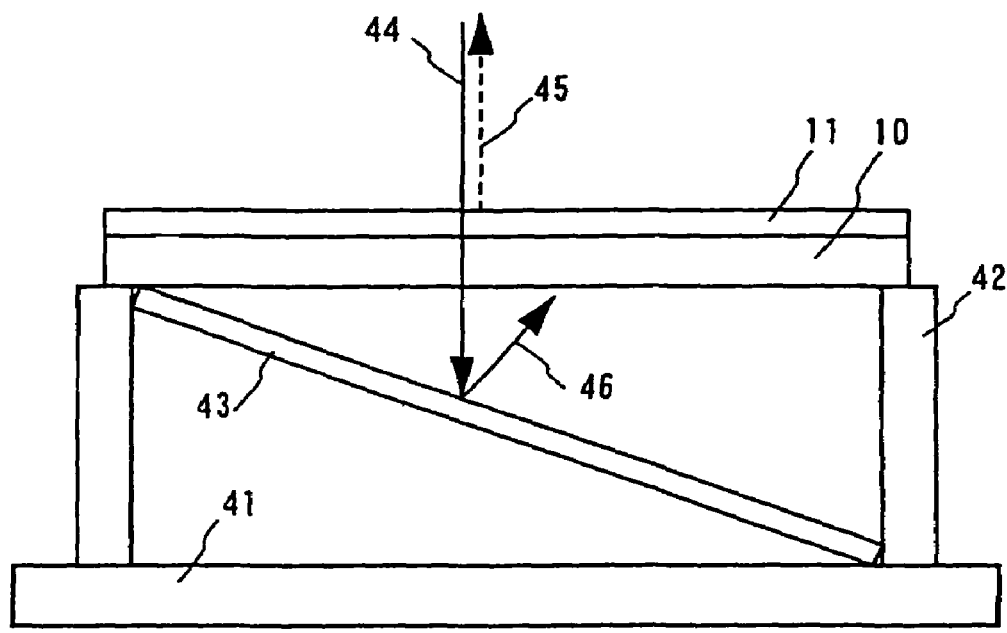
FIG. 4 is a view showing the manner in which laser annealing is performed with the influence of a substrate stage being eliminated.
Figure 5A:
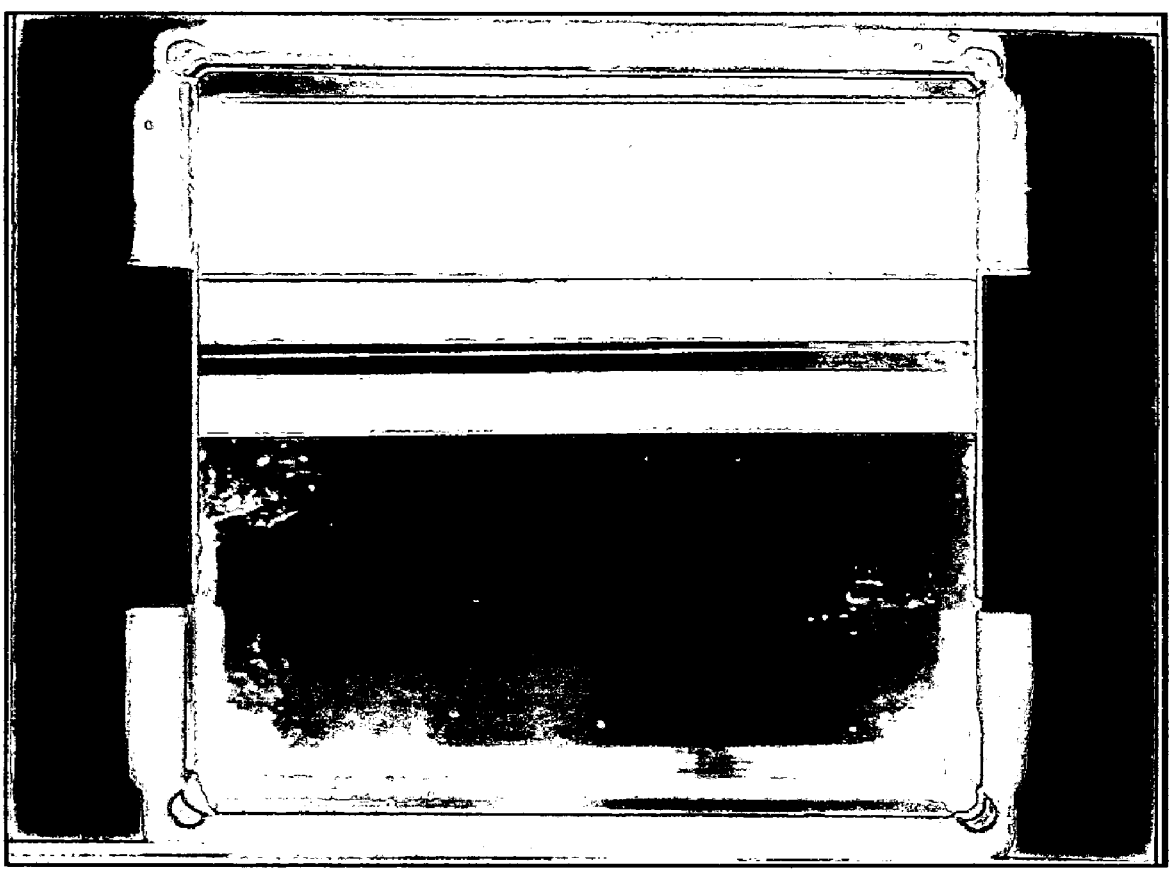
FIGS. 5A and 5B are views showing one example of the results of the laser annealing performed with the influence of the substrate stage being eliminated.
Figure 5B:
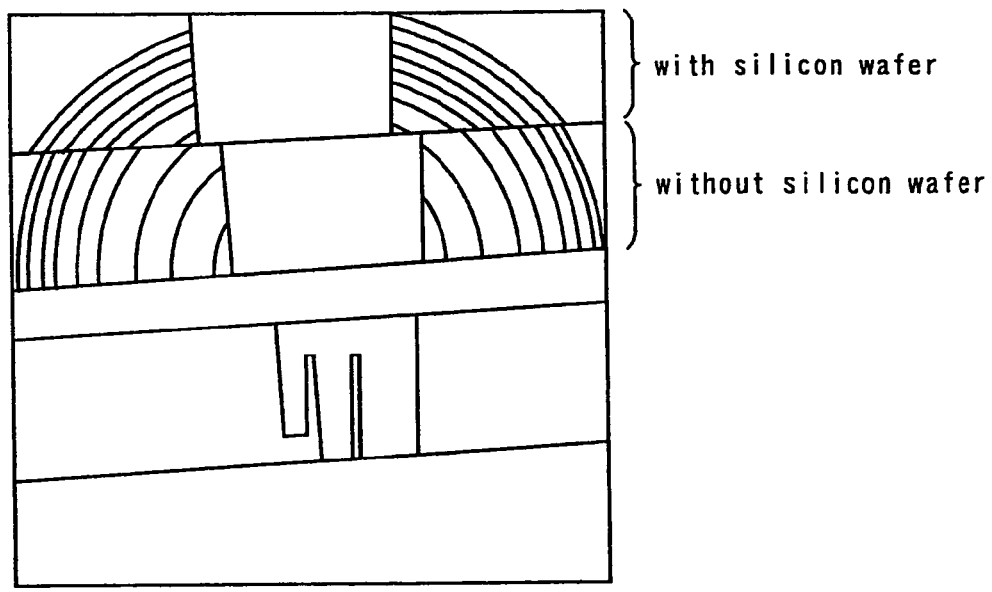
Figure 6:
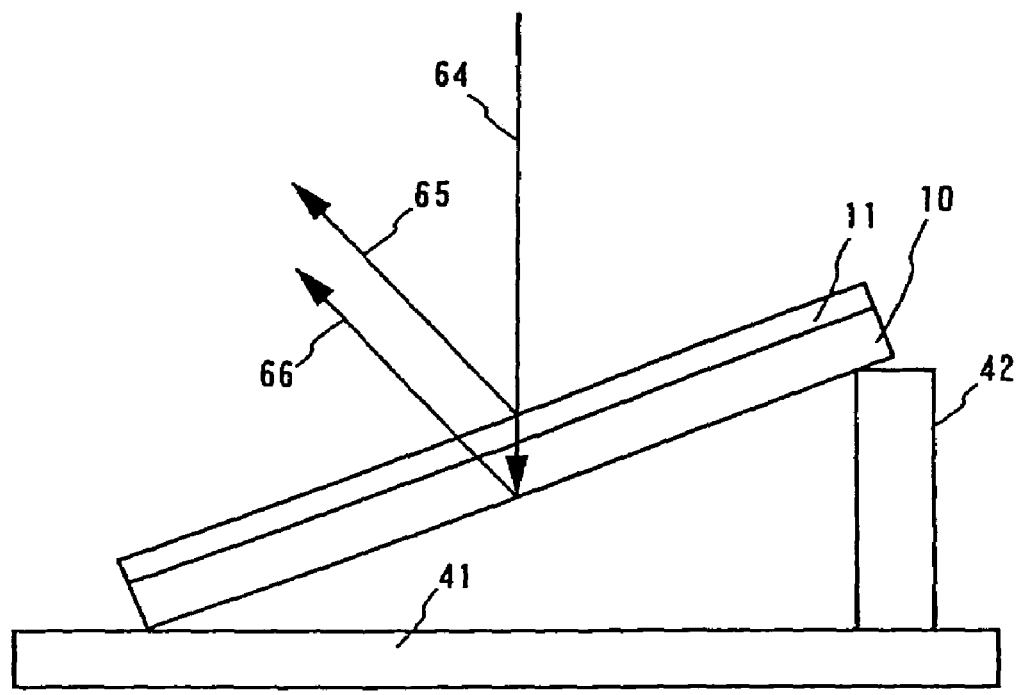
FIG. 6 is a view showing the manner in which laser annealing is performed with the influence of the back surface of the substrate stage being eliminated.
Figure 7A:
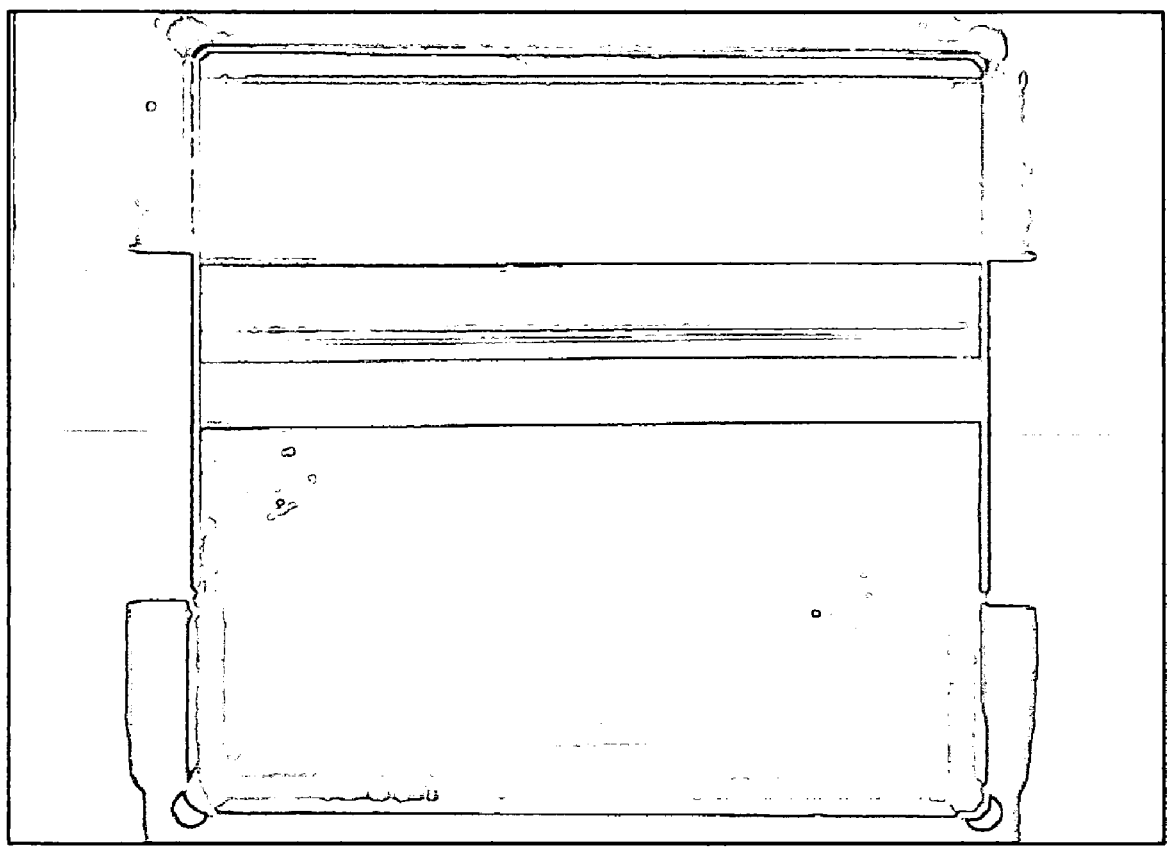
FIGS. 7A and 7B are views showing one example of the results of the laser annealing performed with the influence of the back surface of the substrate stage being eliminated.
Figure 7B:
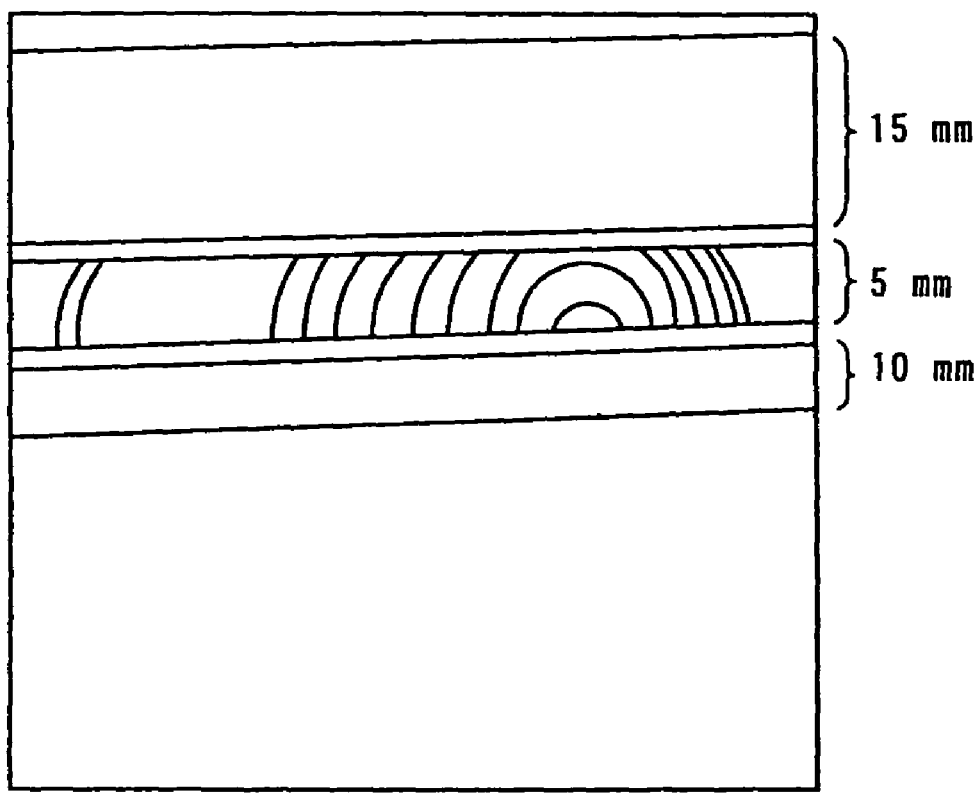
Figure 8:
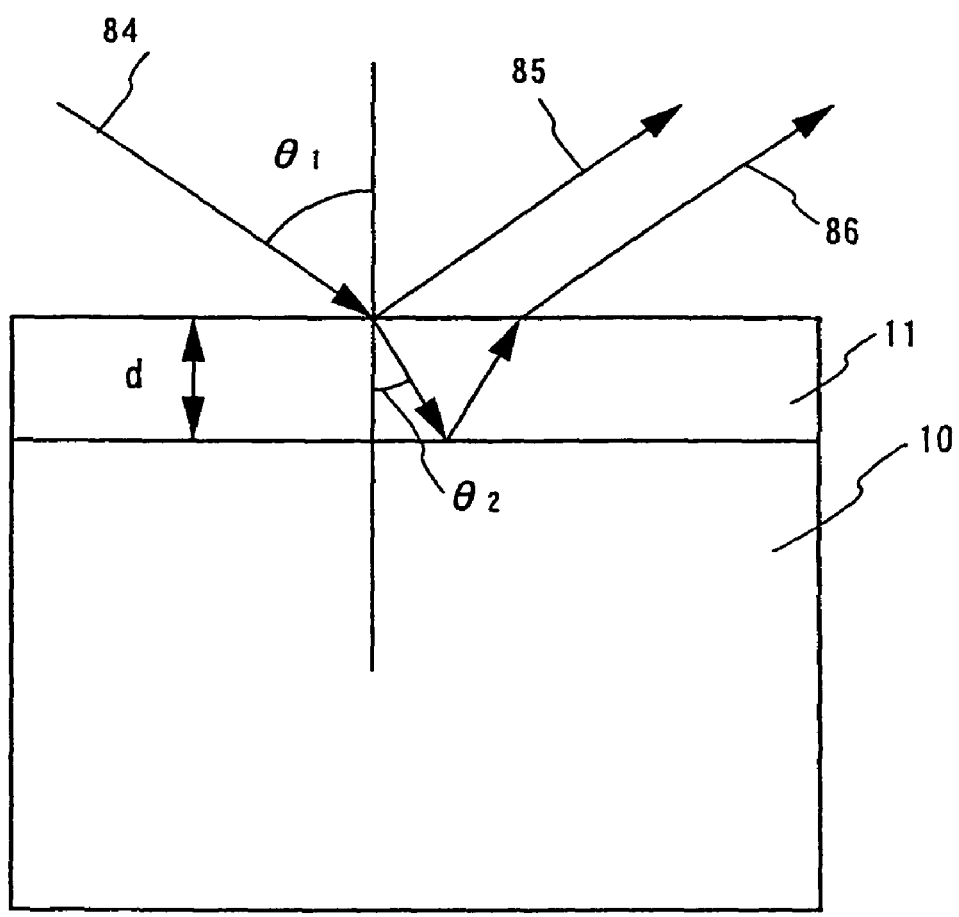
FIG. 8 is a view aiding in considering the interference between a beam reflected from a surface of a semiconductor film and a beam reflected from the interface of the semiconductor film and a substrate.
Figure 9:
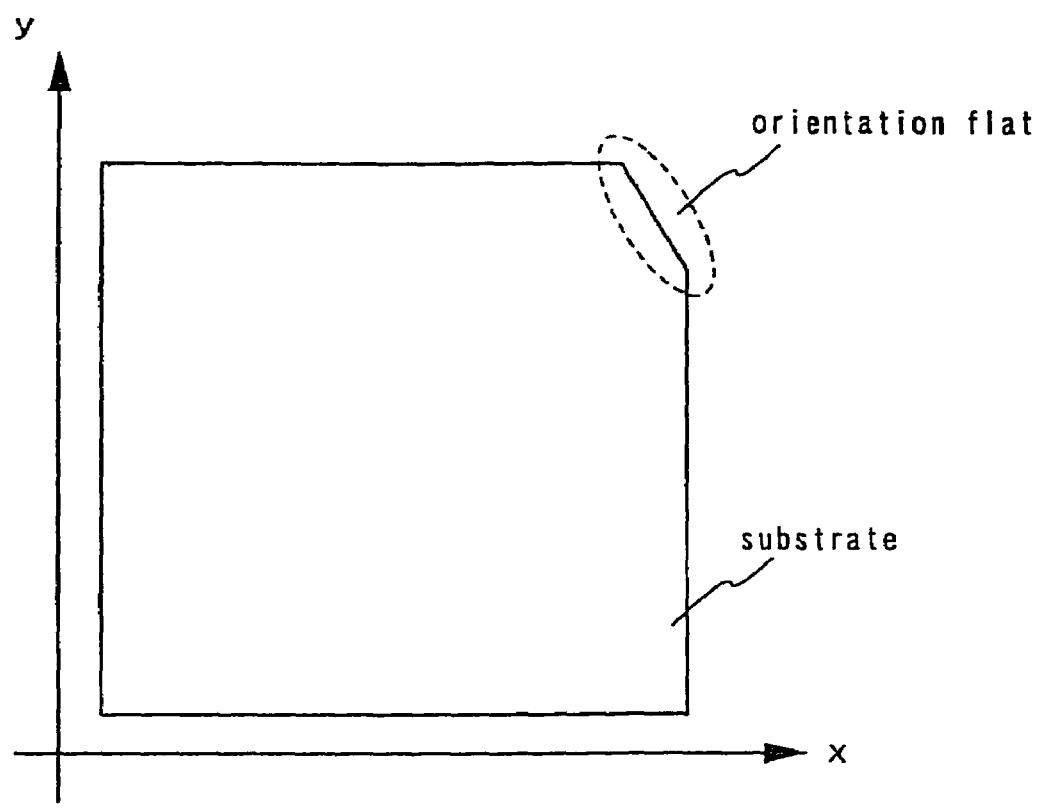
FIG. 9 is an explanatory view of the x and y directions of the substrate.
Figure 10A:
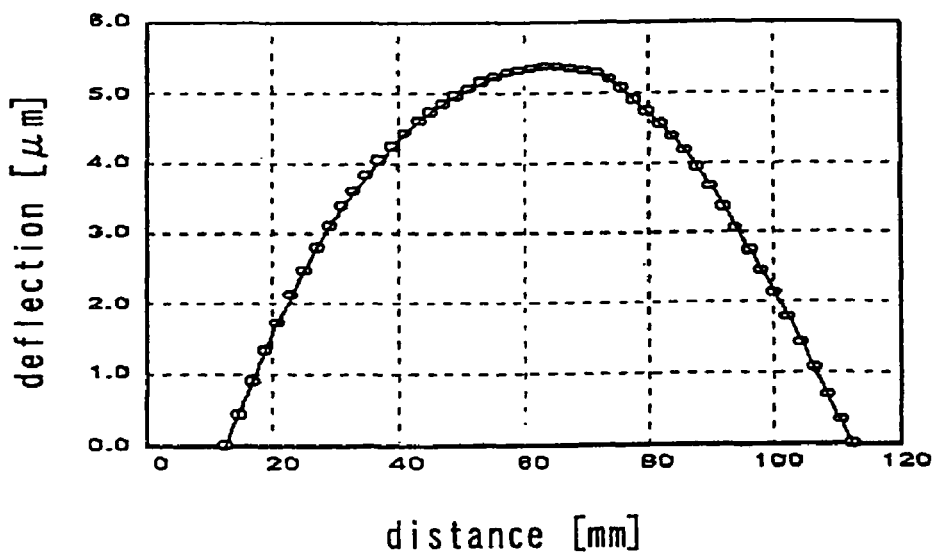
FIG. 10A is a view showing an example of distortion relative to the x direction of the substrate.
Figure 10B:
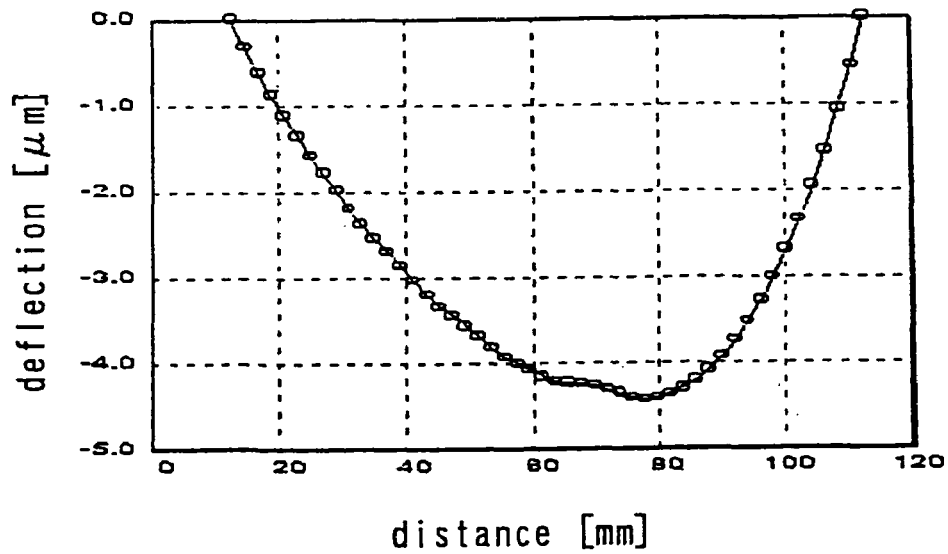
FIG. 10B is a view showing an example of distortion relative to the y direction of the substrate.

The incident angle of a laser beam will be described below with reference to FIG. 1 in connection with preferred embodiments of the invention which will be described later.

A laser beam with a beam width $w_1$ is made incident on a semiconductor film (a target to be irradiated). The incident angle at this time is assumed to be $\theta$. In general, the semiconductor film is deposited to a thickness of 25-80 nm, and since the semiconductor film is very thin compared to a thickness D (0.7 mm) of a glass substrate, the deviation of the optical path of the laser beam due to the semiconductor film can be ignored. Accordingly, the laser beam transmitted through the semiconductor film travels nearly rectilinearly toward the back surface of the substrate, and is reflected at the back surface of the substrate. The laser beam (reflected beam) reflected by the back surface of the substrate reaches the semiconductor film and exits from the substrate. During this time, if the incident beam and the reflected beam do not at all traverse each other on the semiconductor film, the interference of the beams does not occur in the semiconductor film. In other words, a concentric-circle pattern is not formed.

The condition under which the concentric-circle pattern does not occur is expressed from FIG. 1 as follows:

$$D \times \tan\theta \geq w/2, \quad (3)$$

$$\therefore \theta \geq \arctan(w/(2 \times D)) \quad (3)'$$

where $w=(w_1+w_2)/2$. However, the result of the second experiment shows that even if the incident beam and the reflected beam are not completely separated from each other, the concentric-circle pattern can be reduced. Therefore, assuming that D=0.7 [mm], $\tan\theta=5/126$ and $w_1=w_2=w=0.4$ [mm], the condition under which the concentric-circle pattern can be reduced is calculated as follows:

$$0.7 \times 5/126 \geq 0.4/x, \text{ ($x$ is an integer)}$$

$$\therefore x \geq 14.4.$$

However, x is a denominator and can only take on an integer, so that $$x \geq 14.$$

Accordingly, the condition under which the concentric-circle pattern does not occur, which condition is obtained from the experiment, becomes:

$$D \times \tan\theta \geq w/14, \quad (4)$$

$$\therefore \theta \geq \arctan(w/(14 \times D)). \quad (4)'$$

If the semiconductor film is annealed with the laser beam made incident at the angle $\theta$ which satisfies this condition, the concentric-circle pattern which would have so far been formed on the semiconductor film can be reduced, whereby a good crystalline semiconductor film can be formed. A TFT which is fabricated by using this crystalline semiconductor film has good electrical characteristics. Incidentally, in the specification, the angle $\theta$ indicates a deviation from a direction perpendicular to the substrate.

Embodiment 1

Figure 11:
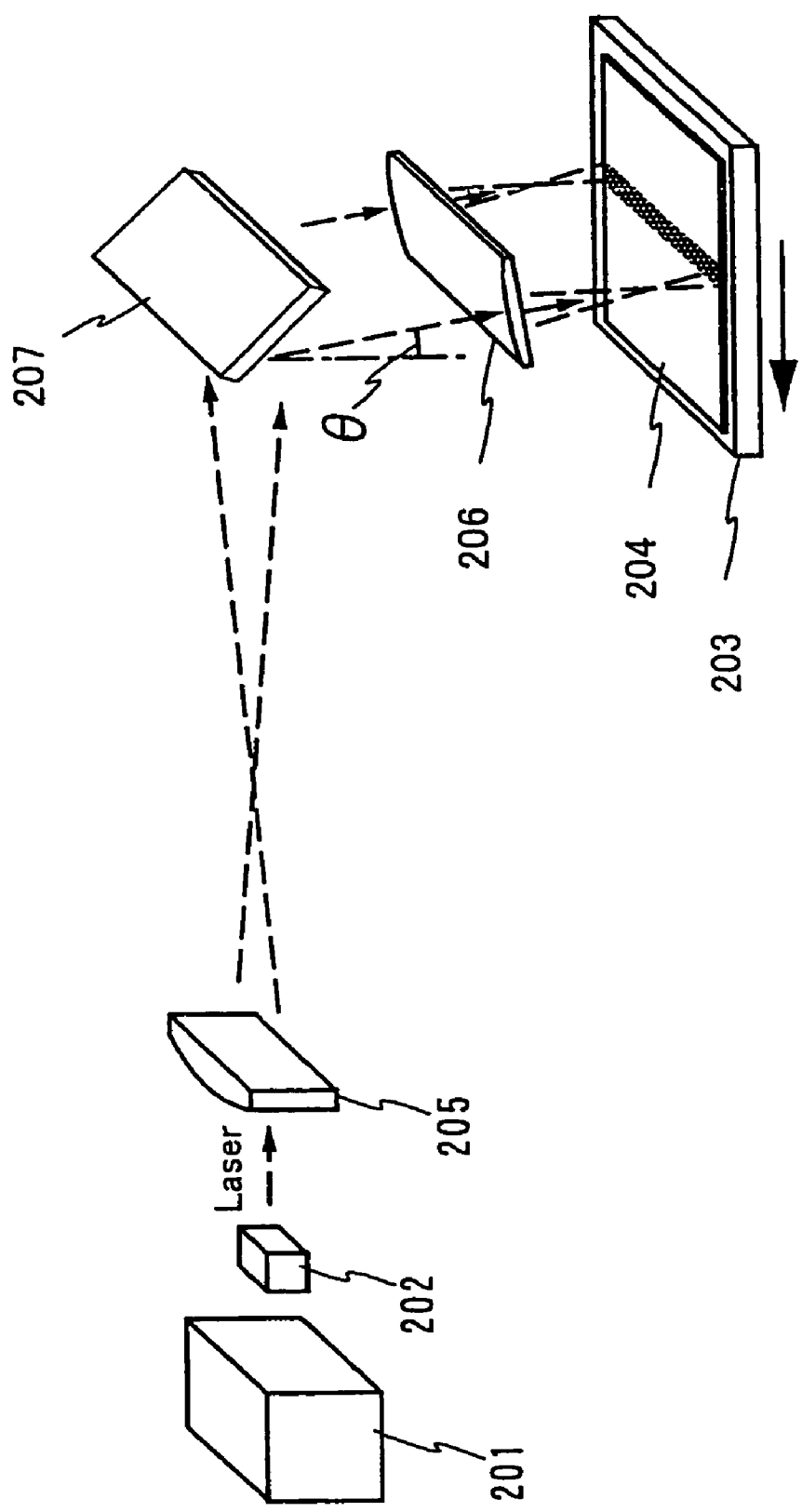
FIG. 11 is a view showing one example of the laser annealing method according to the invention.
Figure 13A:
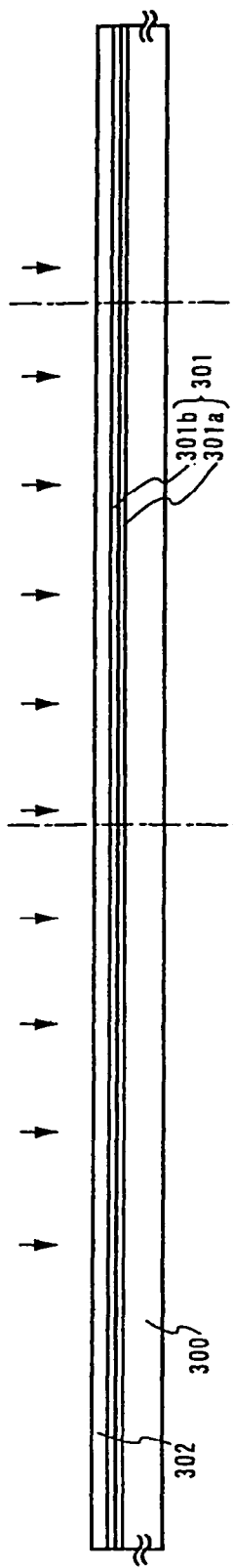
FIGS. 13A to 13C are cross-sectional views showing the process of fabricating pixel TFTs and TFTs for driver circuits.

Embodiment 1 of the invention will be described below with reference to FIGS. 11 and 13A.

First of all, as a substrate 300, a substrate having transparency is prepared which is made of glass such as barium boro-silicate glass or alumina boro-silicate glass represented by the #7059 glass or the #1737 glass of Corning Incorporated. Incidentally, as the substrate 300, a quartz substrate or a silicon substrate may also be used. Otherwise, a plastic substrate which has heat resistance to the treatment temperature used in Embodiment 1 may also be used. In Embodiment 1, a glass substrate was prepared which was made of the #1737 glass of Corning Incorporated and was 126 mm square and 0.7 mm thick.

Then, a base film 301 made of an insulating film such as a silicon oxide film, a silicon nitride film or a silicon nitride oxide film is formed on the substrate 300. In Embodiment 1, the base film 301 may use a two-layer structure, but may also use a single-layer film made of any one of the insulating films or a structure in which two or more of the insulating films are stacked. As the first layer of the base film 301, a silicon nitride oxide film 301a deposited by a plasma CVD method using $SiH_4$, $NH_3$ and $N_2O$ as reaction gases is formed to a thickness of 10-200 nm (preferably, 50-100 nm). In Embodiment 1, the silicon nitride oxide film 301a of thickness 50 nm was formed (composition ratio: Si=32%, O=27%, N=24% and H=17%). Then, as the second layer of the base film 301, a silicon nitride oxide film of thickness 50-200 nm (preferably, 100-150 nm) is formed to be stacked on the first layer, by a plasma CVD method using $SiH_4$ and $N_2O$ as reaction gases. In Embodiment 1, a silicon nitride oxide film 401b of thickness 100 nm was formed (composition ratio: Si=32%, O=59%, N=7% and H=2%).

Then, a semiconductor film 302 is formed over the substrate 300. As the semiconductor film 302, a semiconductor film having an amorphous structure is formed to a thickness of 25-80 nm (preferably, 30-60 nm) by a known method (a sputtering method, an LPCVD method or a plasma CVD method). Although the material of the semiconductor film is not particularly limited, it is preferable to form the semiconductor film from silicon, a silicon germanium (SiGe) alloy or the like. In Embodiment 1, an amorphous silicon film of thickness 55 nm was deposited by using a plasma CVD method.

Incidentally, in Embodiment 1, after the base insulating film such as a silicon nitride film or a silicon nitride oxide film has been formed on the substrate, the semiconductor film is formed. In the case where the semiconductor film is formed after the base insulating film has been formed on the substrate, the number of surfaces by which the laser beam is to be reflected increases. However, since the respective refractive indices of the substrate and the base insulating film are nearly the same as each other, a variation in refractive index at the interface between the base insulating film and the substrate can be ignored.

Then, crystallization of the semiconductor film is performed. Crystallization using a laser annealing method is applied to the crystallization of the semiconductor film. As methods of crystallizing the semiconductor film, there are a thermal crystallization method and a thermal crystallization method using a catalyst such as nickel, in addition to crystallization using a laser annealing method. Otherwise, any one of these crystallization methods and a laser annealing method may be combined. The invention is applied to and embodied in laser crystallization.

In the crystallization using a laser annealing method, it is desirable that hydrogen contained in the amorphous semiconductor film be discharged in advance. Specifically, it is preferable to reduce the hydrogen content to 5 atom % or less by exposing the amorphous semiconductor film to a nitrogen atmosphere at 400-500° C. for approximately one hour. In this manner, the laser resistance of the film is remarkably improved.

An optical system for the laser beam will be described below with reference to FIG. 11. As a laser oscillator 201, it is desirable to use a high-power, continuous- or pulse-oscillation solid-state laser (a YAG laser, a $YVO_4$ laser, a YLF laser, a $YAlO_3$ laser, a ruby laser, an alexandrite laser, a Ti:sapphire laser or the like). Of course, a gas laser, a glass laser or the like may also be used as long as it has high power. The laser light generated from the laser oscillator 201 is formed into a linear beam whose irradiation plane has a linear shape, by using the optical system. The optical system uses, for example, a long focal length cylindrical lens 205 for enlarging a laser beam into a long beam, and a cylindrical lens 206 for converging a laser beam into a thin beam. By using such long focal length cylindrical lenses, it is possible to obtain a laser beam which is reduced in aberration and is uniform in energy distribution at or near the irradiation plane. In addition, the long focal length cylindrical lenses are effective in restraining a remarkable difference from occurring between the beam width of a beam incident on the semiconductor film and the beam width of a beam reflected from the back surface of the substrate. Experiments of the present inventor showed that when a cylindrical lens having a focal length of 500 mm or more was used, the influence of aberration was able to be drastically reduced.

A reflecting mirror 207 is provided in front of the cylindrical lens 206 so that the traveling direction of the laser beam can be changed. The angle at which the laser beam is made incident on the irradiation plane can be adjusted to the desired angle θ by the reflecting mirror 207. If the angle of the cylindrical lens 206 is changed according to the angle of the reflecting mirror 207, a laser beam having far higher symmetry can be formed on the irradiation plane.

In addition, when linear beams are to be irradiated onto a semiconductor film, the linear beams may also be irradiated with an overlap percentage of 50-98% or without overlap. Since optimum conditions differ according to the states of semiconductor films or the delay periods of laser beams, it is preferable that an operator appropriately determine the optimum conditions.

In Embodiment 1, a YAG laser was used as the laser oscillator 201. The output from the YAG laser was modulated into the second harmonic by a non-linear optical element 202 and was then formed into a linear beam of length 130 mm and width 0.4 mm by using the optical system, and the linear beam was irradiated onto the semiconductor film. At this time, the linear beam was irradiated with an angular deviation of 5 degrees from the direction perpendicular to the substrate. Since the cylindrical lens 206 having a long focal length was used, $w_1=w_2=w=0.4$ [mm] may be used. If the irradiation condition of Embodiment 1 is applied to Expression (4), the left-hand side becomes:

0.7×tan 5=0.0612, and the right-hand side becomes:

0.4/8=0.0500.

Accordingly, Expression (4) is satisfied, and a concentric-circle pattern was not observed on the crystalline semiconductor film obtained by the laser annealing. A TFT which is fabricated by using this crystalline semiconductor film has good electrical characteristics.

Embodiment 2

Figure 12:
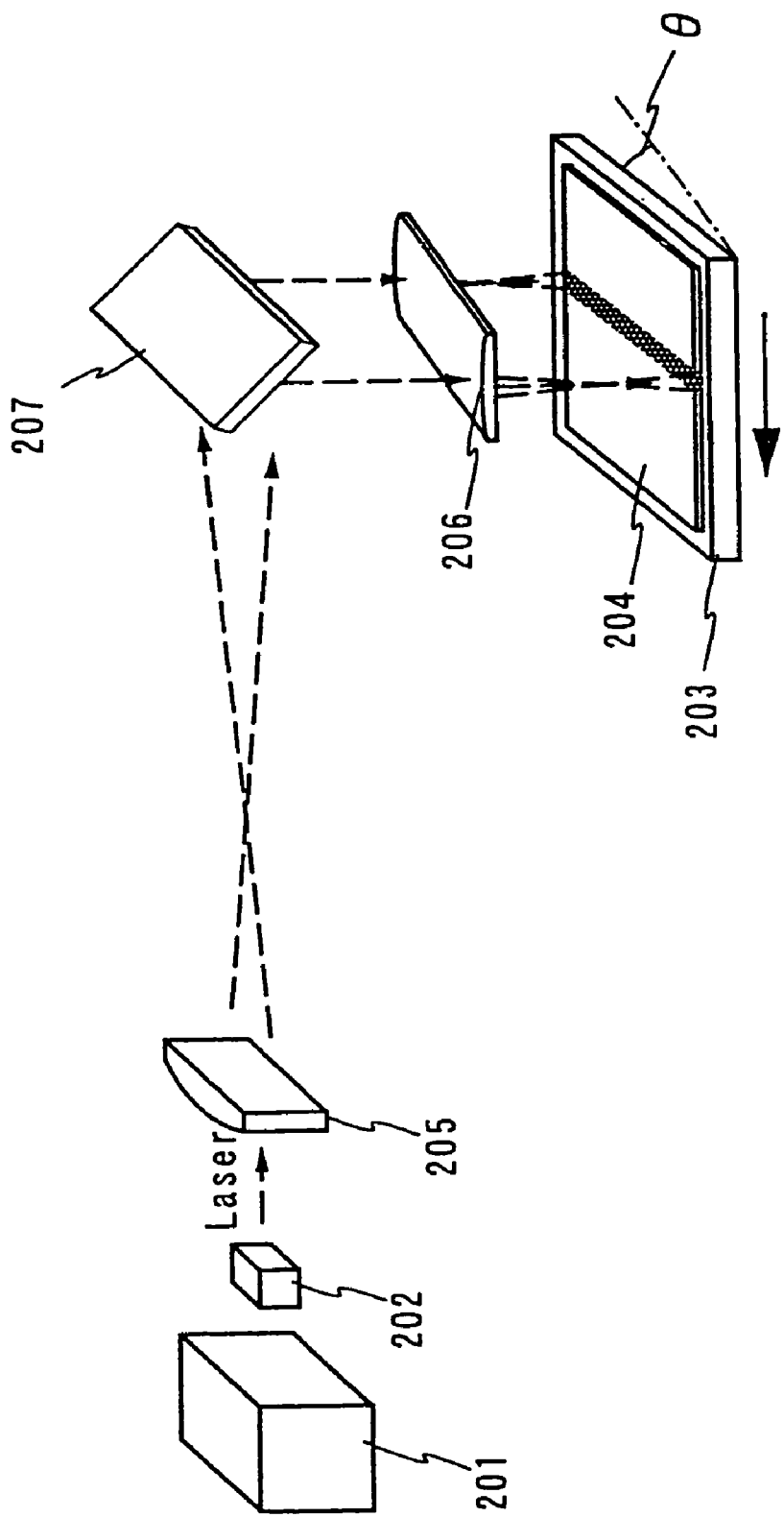
FIG. 12 is a view showing another example of the laser annealing method according to the invention.

Embodiment 2 which differs from Embodiment 1 will be described below with reference to FIG. 12.

A substrate and a semiconductor film were fabricated in accordance with the process of Embodiment 1. In Embodiment 2 as well, a #1737 glass substrate made by Corning Incorporated was used, and an amorphous silicon film (of thickness 55 nm) was formed over the glass substrate by a CVD method.

The optical system of Embodiment 2 will be described below with reference to FIG. 12. In FIG. 12, the same reference numerals are used to denote parts corresponding to those used in the optical system shown in FIG. 11. In Embodiment 2, the reflecting mirror 207 is fixed at 45 degrees with respect to the laser beam, and a substrate stage 203 is inclined by an angle θ from the horizontal direction.

In Embodiment 2, a YAG laser was used as the laser oscillator 201. The output from the YAG laser was modulated into the second harmonic by the non-linear optical element 202 and was then formed into a linear beam of length 130 mm and width 0.4 mm by using the optical system, and the linear beam was irradiated onto the semiconductor film. At this time, the linear beam was irradiated with an angular deviation of 10 degrees from the direction perpendicular to the substrate. Since the cylindrical lens 206 having a long focal length was used, $w_1=w_2=w=0.4$ [mm] may be used. If the irradiation condition of Embodiment 1 is applied to Expression (4), the left-hand side becomes:

0.7×tan 10=0.1234 and the right-hand side becomes:

0.4/8=0.0500.

Accordingly, Expression (4) is satisfied, and a concentric-circle pattern was not observed on the crystalline semiconductor film obtained by the laser annealing. A TFT which is fabricated by using this crystalline semiconductor film has good electrical characteristics.

Embodiment 3

In this embodiment, the manufacturing method of the active matrix substrate is explained using FIGS. 13 to 21.

First, in this embodiment, a substrate 300 is used, which is made of glass such as barium borosilicate glass or aluminum borosilicate, represented by such as Corning #7059 glass and #1737 glass. Note that, as the substrate 300, a quartz substrate, a silicon substrate, a metallic substrate or a stainless substrate on which is formed an insulating film. A plastic substrate with heat resistance to a process temperature of this embodiment may also be used.

Then, a base film 301 formed of an insulating film such as a silicon oxide film, a silicon nitride film or a silicon oxynitride film is formed on the substrate 300. In this embodiment, a two-layer structure is used as the base film 301. However, a single-layer film or a lamination structure consisting of two or more layers of the insulating film may be used. As a first layer of the base film 301, a silicon oxynitride film 301a is formed with a thickness of 10 to 200 nm (preferably 50 to 100 nm) with a plasma CVD method using $SiH_4$, $NH_3$, and $N_2O$ as reaction gas. In this embodiment, the silicon oxynitride film 301a (composition ratio Si=32%, O=27%, N=24% and H=17%) with a film thickness of 50 nm is formed. Then, as a second layer of the base film 301, a silicon oxynitride film 301b is formed and laminated into a thickness of 50 to 200 nm (preferably 100 to 150 nm) with a plasma CVD method using $SiH_4$ and $N_2O$ as reaction gas. In this embodiment, the silicon oxynitride film 401b (composition ratio Si=32%, O=59%, N=7% and H=2%) with a film thickness of 100 nm is formed.

Subsequently, semiconductor layer 302 are formed on the base film. The semiconductor layer 302 are formed from a semiconductor film with an amorphous structure which is formed by a known method (such as a sputtering method, an LPCVD method, or a plasma CVD method) into the thickness of from 25 to 80 nm (preferably 30 to 60 nm). The material of the semiconductor film is not particularly limited, but it is preferable to be formed of silicon, a silicon germanium (SiGe) alloy, or the like. In this embodiment, 55 nm thick amorphous silicon film is formed by a plasma CVD method.

Next, the crystallization of the semiconductor film is conducted. The laser crystallization is applied to the crystallization of the semiconductor film. Further, other than laser crystallization, thermal crystallization or thermal crystallization using nickel as a catalyst are applicable for a crystallization of the semiconductor film. The crystallization of the semiconductor film is subjected by a method of combination in which laser crystallization and one of these crystallization methods above. The laser crystallization is implemented by applying the present invention. For example, the laser light, by which a solid laser (YAG laser, $YVO_4$ laser, YLF laser, $YalO_3$ laser, ruby laser, alexandrite laser, Ti:sapphire laser, glass laser or the like) is set as a light source, is processed in to a linear beam. The laser light is irradiated to the semiconductor film by using a method shown in FIG. 11 or 12. In this embodiment, after the substrate is exposed in the nitrogen atmosphere of 500° C. temperature for 1 hour, the crystallization of the semiconductor film is conducted by the laser annealing shown in FIG. 11, whereby the crystalline silicon film having the crystal grains of large grain size is formed. Here, the YAG laser is used for the laser oscillator. The laser light modulated into the second harmonic by nonlinear optical element is processed into the linear beam by an optical system and irradiated to the semiconductor film. When the linear beam is irradiated to the semiconductor film, although the overlap ratio can be set from 50 to 98%, the ratio may be set suitably by the operator because the optimum conditions are different according to the state of the semiconductor film and the wavelength of the laser light.

Thus formed the crystalline semiconductor film is patterned into the desired shape to form the semiconductor layers 402 to 406. In this embodiment, the crystalline silicon film is patterned by using the photolithography to form the semiconductor layers 402 to 406.

Further, after the formation of the semiconductor layers 402 to 406, a minute amount of impurity element (boron or phosphorus) may be doped to control a threshold value of the TFT.

A gate insulating film 407 is then formed for covering the semiconductor layers 402 to 406. The gate insulating film 407 is formed of an insulating film containing silicon by a plasma CVD method or a sputtering method into a film thickness of from 40 to 150 nm. In this embodiment, the gate insulating film 407 is formed of a silicon oxynitride film into a thickness of 110 nm by a plasma CVD method (composition ratio Si=32%, O=59%, N=7%, and H=2%). Of course, the gate insulating film is not limited to the silicon oxynitride film, and an other insulating film containing silicon may be used as a single layer or a lamination structure.

Besides, when the silicon oxide film is used, it can be possible to be formed by a plasma CVD method in which TEOS (tetraethyl orthosilicate) and $O_2$ are mixed and discharged at a high frequency (13.56 MHz) power density of 0.5 to 0.8 $W/cm^2$ with a reaction pressure of 40 Pa and a substrate temperature of 300 to 400° C. Good characteristics as the gate insulating film can be obtained in the manufactured silicon oxide film thus by subsequent thermal annealing at 400 to 500° C.

Figure 13B:
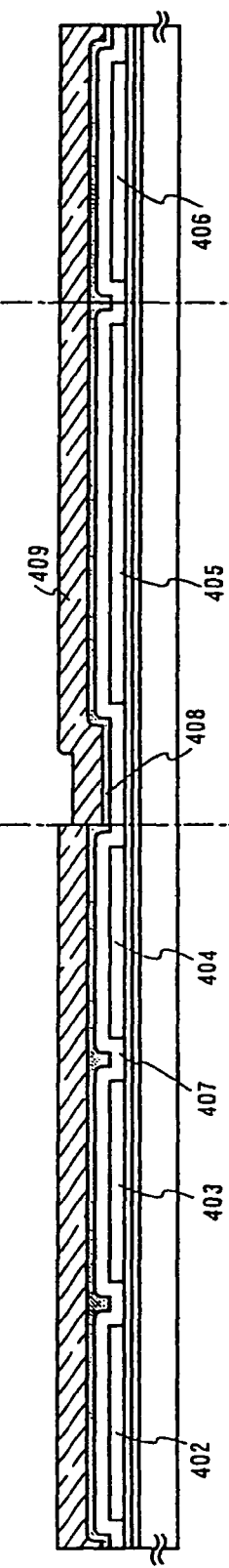
Figure 13C:
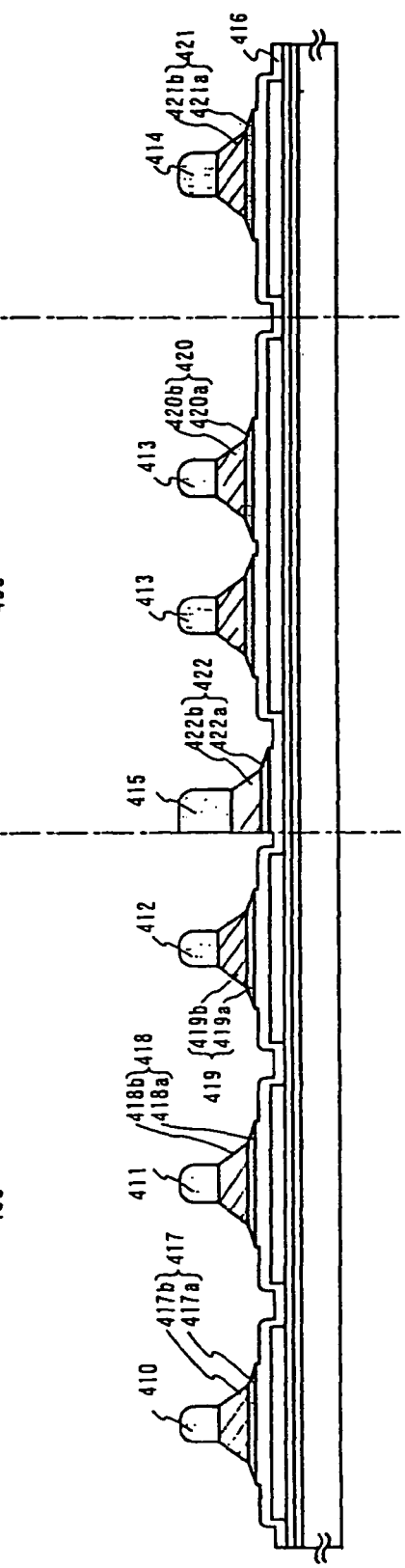

Then, as shown in FIG. 13B, on the gate insulating film 407, a first conductive film 408 with a thickness of 20 to 100 nm and a second conductive film 409 with a thickness of 100 to 400 nm are formed and laminated. In this embodiment, the first conductive film 408 of TaN film with a film thickness of 30 nm and the second conductive film 409 of a W film with a film thickness of 370 nm are formed into lamination. The TaN film is formed by sputtering with a Ta target under a nitrogen containing atmosphere. Besides, the W film is formed by the sputtering method with a W target. The W film may be formed by a thermal CVD method using tungsten hexafluoride ($WF_6$). Whichever method is used, it is necessary to make the material have low resistance for use as the gate electrode, and it is preferred that the resistivity of the W film is set to less than or equal to 20 µΩcm. By making the crystal grains large, it is possible to make the W film have lower resistivity. However, in the case where many impurity elements such as oxygen are contained within the W film, crystallization is inhibited and the resistance becomes higher. Therefore, in this embodiment, by forming the W film by a sputtering method using a W target with a high purity of 99.9999% and in addition, by taking sufficient consideration to prevent impurities within the gas phase from mixing therein during the film formation, a resistivity of from 9 to 20 µΩcm can be realized.

Note that, in this embodiment, the first conductive film 408 is made of TaN, and the second conductive film 409 is made of W, but the material is not particularly limited thereto, and either film may be formed of an element selected from the group consisting of Ta, W, Ti, Mo, Al, Cu, Cr, and Nd, or an alloy material or a compound material containing the above element as its main constituent. Besides, a semiconductor film, typified by a polycrystalline silicon film doped with an impurity element such as phosphorus, may be used. Further, an AgPdCu alloy may be used. Besides, any combination may be employed such as a combination in which the first conductive film is formed of tantalum (Ta) and the second conductive film is formed of W, a combination in which the first conductive film is formed of titanium nitride (TiN) and the second conductive film is formed of W, a combination in which the first conductive film is formed of tantalum nitride (TaN) and the second conductive film is formed of Al, or a combination in which the first conductive film is formed of tantalum nitride (TaN) and the second conductive film is formed of Cu.

Next, masks 410 to 415 made of resist are formed using a photolithography method, and a first etching process is performed in order to form electrodes and wirings. This first etching process is performed with the first and second etching conditions. In this embodiment, as the first etching conditions, an ICP (inductively coupled plasma) etching method is used, a gas mixture of $CF_4$, $Cl_2$ and $O_2$ is used as an etching gas, the gas flow rate is set to 25/25/10 sccm, and plasma is generated by applying a 500 W RF (13.56 MHz) power to a coil shape electrode under 1 Pa. A dry etching device with ICP (Model E645-☐ICP) produced by Matsushita Electric Industrial Co. Ltd. is used here. A 150 W RF (13.56 MHz) power is also applied to the substrate side (test piece stage) to effectively apply a negative self-bias voltage. The W film is etched with the first etching conditions, and the end portion of the first conductive layer is formed into a tapered shape.

Thereafter, the first etching conditions are changed into the second etching conditions without removing the masks 410 to 415 made of resist, a mixed gas of $CF_4$ and $Cl_2$ is used as an etching gas, the gas flow rate is set to 30/30 sccm, and plasma is generated by applying a 500 W RF (13.36 MHz) power to a coil shape electrode under 1 Pa to thereby perform etching for about 30 seconds. A 20 W RF (13.56 MHz) power is also applied to the substrate side (test piece stage) to effectively apply a negative self-bias voltage. The W film and the TaN film are both etched on the same order with the second etching conditions in which $CF_4$ and $Cl_2$ are mixed. Note that, the etching time may be increased by approximately 10 to 20% in order to perform etching without any residue on the gate insulating film.

In the first etching process, the end portions of the first and second conductive layers are formed to have a tapered shape due to the effect of the bias voltage applied to the substrate side by adopting masks of resist with a suitable shape. The angle of the tapered portions may be set to 15° to 45°. Thus, first shape conductive layers 417 to 422 (first conductive layers 417a to 422a and second conductive layers 417b to 422b) constituted of the first conductive layers and the second conductive layers are formed by the first etching process. Reference numeral 416 denotes a gate insulating film, and regions of the gate insulating film which are not covered by the first shape conductive layers 417 to 422 are made thinner by approximately 20 to 50 nm by etching.

Figure 14A:
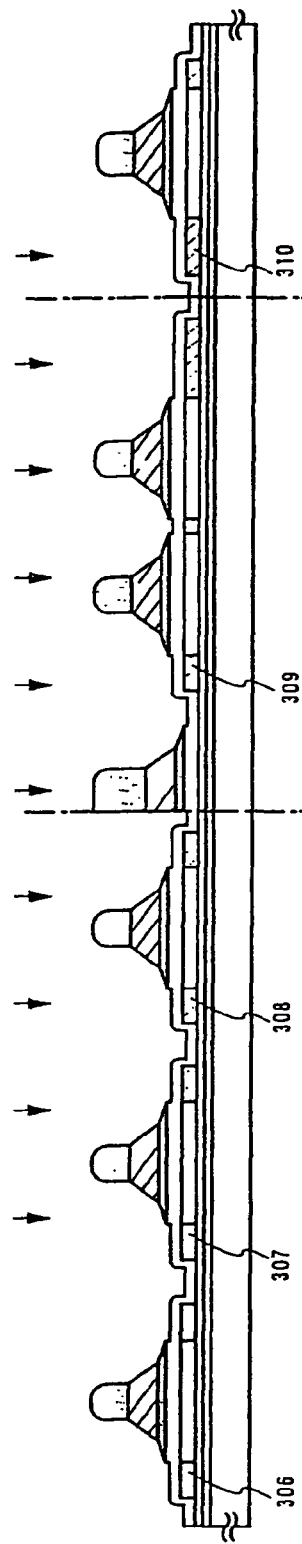
FIGS. 14A to 14C are cross-sectional views showing the process of fabricating the pixel TFTs and the TFTs for driver circuits.

Then, a first doping process is performed to add an impurity element for imparting an n-type conductivity to the semiconductor layer without removing the mask made of resist (FIG. 14A). Doping may be carried out by an ion doping method or an ion injection method. The condition of the ion doping method is that a dosage is $1 \times 10^{13}$ to $5 \times 10^{15}/cm^2$, and an acceleration voltage is 60 to 100 keV. In this embodiment, the dosage is $1.5 \times 10^{15}/cm^2$ and the acceleration voltage is 80 keV. As the impurity element for imparting the n-type conductivity, an element which belongs to group 15 of the periodic table, typically phosphorus (P) or arsenic (As) is used, and phosphorus is used here. In this case, the conductive layers 417 to 422 become masks to the impurity element for imparting the n-type conductivity, and high concentration impurity regions 306 to 310 are formed in a self-aliening manner. The impurity element for imparting the n-type conductivity is added to the high concentration impurity regions 306 to 310 in the concentration range of $1 \times 10^{20}$ to $1 \times 10^{21}/cm^3$.

Thereafter, a second etching process is performed without removing the masks made of resist. A mixed gas of $CF_4$, $Cl_2$ and $O_2$ may be used as etching gas and the W film is selectively etched. The second conductive layers 428b to 433b are formed by a second etching process. On the other hand, the first conductive layers 417a to 422a are hardly etched, and the second conductive layers 428 to 433 are formed.

Figure 14B:
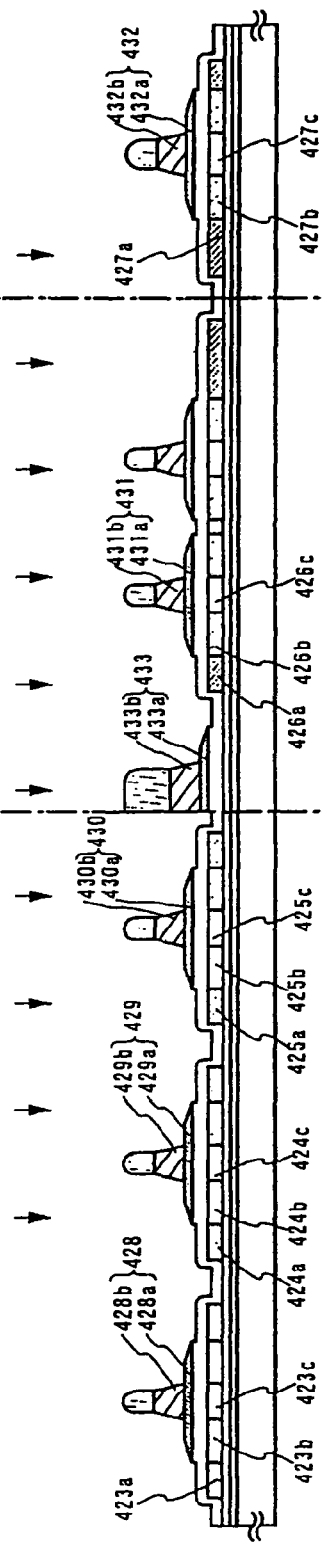

Next, a second doping process is performed as shown in FIG. 14B without removing the masks from resists. The impurity elements which imparts n-type conductivity is doped under the condition that the dose amount is lower than that of a first doping process with an acceleration voltage 70 to 120 keV. In this embodiment, the dosage is $1.5 \times 10^{14}/cm^2$, and the acceleration voltage is 90 keV. The second doping process is using a second shaped conductive layers 428 to 433 as masks, and the impurity elements is doped with a semiconductor layer at the below of the second conductive layers 428b to 433b. The second high concentration impurity regions 423a to 427a and low concentration impurity region 423b to 427b are newly formed.

Figure 14C:
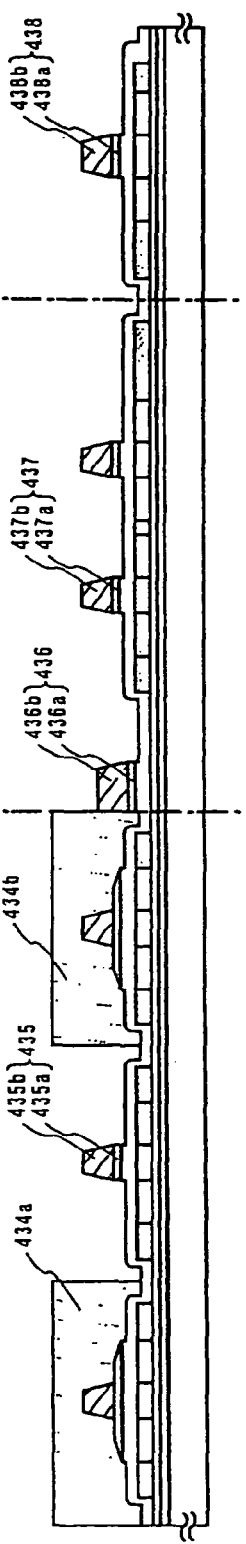

Next, after the masks are removed, masks 434a and 434b from resists are newly formed, and the third etching process is performed as shown in FIG. 14C. A mixed gas of $SF_6$, and $Cl_2$ is used as an etching gas, the gas flow rate is set to 50/10 sccm, and plasma is generated by applying a 500 W RF (13.56 MHz) power to a coil shape electrode under 1.3 Pa to thereby perform etching for about 30 seconds. A 10 W RF (13.56 MHz) power is also applied to the substrate side (test piece stage) to effectively applied to a negative self-bias voltage. Thus the third shape conductive layers 435 to 438 are formed by etching a TaN film of the p-channel type TFT and the TFT of the pixel portion (pixel TFT) using above-mentioned third etching process.

Figure 15A:
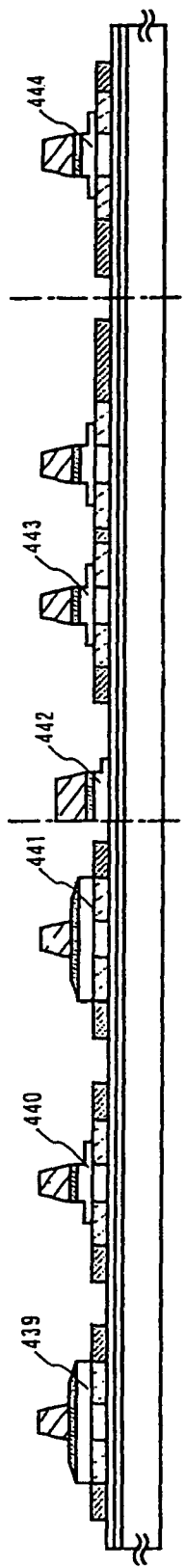
FIGS. 15A to 15C are cross-sectional views showing the process of fabricating the pixel TFTs and the TFTs for driver circuits.
Figure 15B:
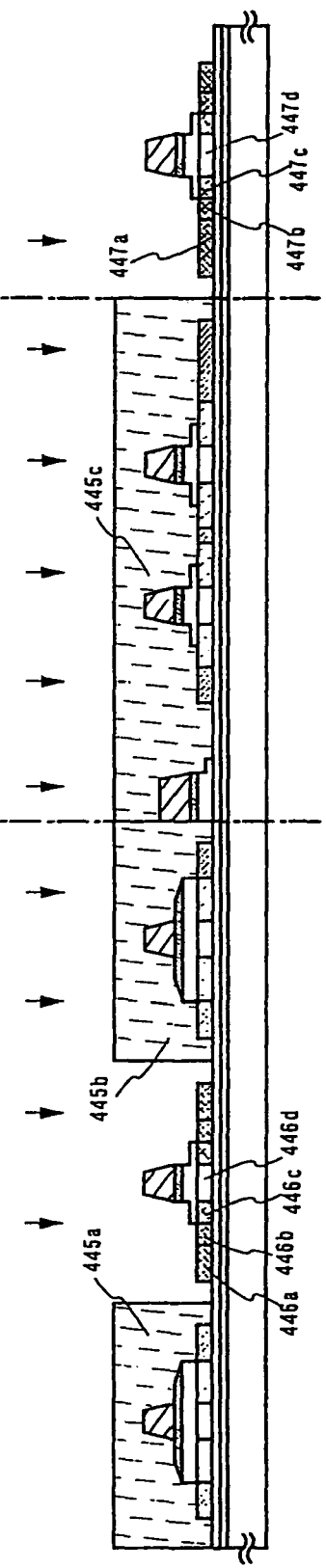

Next, after removing the masks from resists, the insulating layers 439 to 444 are formed, removing selectively the gate insulating film 416 and using the second shape conductive layer 428, 430 and the second shape conductive layers 435 to 438 as a mask. (FIG. 15A)

Successively, there is carried out a third doping processing by newly forming masks 445a to 445c comprising resists. By the third doping processing, there are formed impurity regions 446, 447 added with an impurity element for providing a conductive type reverse to the above-described one conductive type at semiconductor layers constituting activation layers of p-channel type TFTs. The impurity regions are formed self-adjustingly by adding the impurity element providing p-type by using the second conductive layers 435a, 438a as masks against the impurity element. In this embodiment, the impurity regions 446 and 447 are formed by an ion doping process using diborane ($B_2H_6$). (FIG. 15B) In the third doping processing, the semiconductor layers forming n-channel type TFTs are covered by the masks 445a to 445c comprising resists. Although the impurity regions 446, 447 are added with phosphorus at concentrations different from each other by the first doping processing and the second doping process, in any of the regions, by carrying out the doping processing such that the concentration of the impurity element for providing p-type falls in a range of $2 \times 10^{20}$ through $2 \times 10^{21}/cm^3$, the impurity regions function as source regions and drain regions of p-channel type TFTs and accordingly, no problem is posed. In this embodiment, portions of the semiconductor layers constituting activation layers of p-channel type TFTs are exposed and accordingly, there is achieved an advantage that the impurity element (boron) is easy to add thereto.

The impurity regions are formed at the respective semiconductor layers by the above-described steps.

Next, a first interlayer insulating film 461 is formed by removing the masks 445a to 445c comprising resists. The first interlayer insulating film 461 is formed by an insulating film including silicon and having a thickness of 100 through 200 nm by using a plasma CVD process or a sputtering process. In this embodiment, a silicon oxynitride film having a film thickness of 150 nm is formed by a plasma CVD process. Naturally, the first interlayer insulating film 461 is not limited to the silicon oxynitride film but other insulating film including silicon may be used as a single layer or a laminated structure.

Figure 15C:
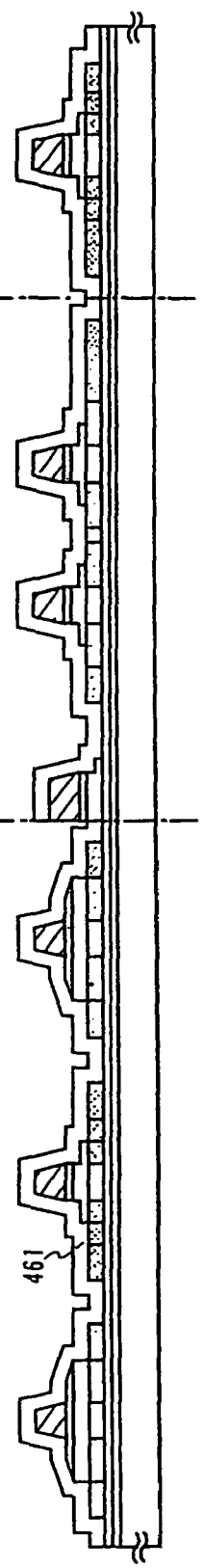

Next, as shown by FIG. 15C, there is carried out a step of activating the impurity elements added to the respective semiconductor layers. The activating step is carried out by a thermal annealing process using a furnace annealing furnace. The thermal annealing process may be carried out in a nitrogen atmosphere having an oxygen concentration equal to or smaller than 1 ppm, preferably, equal to or smaller than 0.1 ppm at 400 through 700° C. representatively, 500 through 550° C. and in this embodiment, the activation is carried out by a heat treatment at 550° C. for 4 hours. Further, other than the thermal annealing process, a laser annealing process or a rapid thermal annealing process (RTA process) is applicable.

Further, when the thermal crystallization is also applied, which is using nickel or the like as a catalyst in the crystallizing step, the impurity regions 423a, 425a, 426a, 446a and 447a in which the material elements include a high concentration of phosphorus are crystallized simultaneously with the activation. Therefore above-mentioned metal elements are gettered by the above mentioned impurity regions and a metal element concentration in the semiconductor layer mainly constituting a channel-forming region is reduced. According to TFT having the channel forming region fabricated in this way, the off current value is reduced, crystalline performance is excellent and therefore, there is provided high field effect mobility and excellent electric properties can be achieved.

Further, the heat treatment may be carried out prior to forming the first interlayer insulating film. However, when a wiring material used is weak at heat, it is preferable to carry out the activation after forming the interlayer insulating film (insulating film whose major component is silicon, for example, silicon nitride film) for protecting wirings as in this embodiment.

Further, there is carried out a step of hydrogenating the semiconductor layer by carrying out a heat treatment in an atmosphere including 3 to 100% of hydrogen at 300 to 550° C. for 1 through 12 hours. In this embodiment, there is carried out a heat treatment in a nitrogen atmosphere including about 3% of hydrogen at 410° C. for 1 hour. The step is a step of terminating dangling bond of the semiconductor layer by hydrogen included in the interlayer insulating film. As other means of hydrogenation, there may be carried out plasma hydrogenation (using hydrogen excited by plasma).

Further, when a laser annealing is used as an activation, it is preferable to irradiate laser beam of YAG laser or the like after carrying out the hydrogenation.

Next, there is formed a second interlayer insulating film 462 comprising an inorganic insulating material or an organic insulating material above the first interlayer insulating film 461. In this embodiment, there is formed a acrylic resin film having film thickness of 1.6 μm and there is used a film having a viscosity of 10 to 1000 cp, preferably, 40 through 200 cp and formed with projections and recesses at a surface thereof.

In this embodiment, in order to prevent the mirror reflection, projection and recess portions are formed on the surfaces of the pixel electrodes by forming the second interlayer insulating film with projection and recess portions on the surface. Also, in order to attain light scattering characteristics by forming the projection and recess portions on the surfaces of the pixel electrodes, projection portions may be formed in regions below the pixel electrodes. In this case, since the same photomask is used in the formation of the TFTs, the projection portions can be formed without increasing the number of processes. Note that the projection portion may be suitably provided in the pixel portion region except for the wirings and the TFT portion on the substrate. Thus, the projection and recess portions are formed on the surfaces of the pixel electrodes along the projection and recess portions formed on the surface of the insulating film covering the projection portion.

Also, a film with the leveled surface may be used as the second interlayer insulating film 462. In this case, the following is preferred. That is, after the formation of the pixel electrodes, projection and recess portions are formed on the surface with a process using a known method such as a sandblast method or an etching method. Thus, since the mirror reflection is prevented and reflection light is scattered, whiteness is preferably increased.

Then, in a driver circuit 506, wirings 463 to 467 electrically connected with the respective impurity regions are formed. Note that those wirings are formed by patterning a lamination film of a Ti film with a film thickness of 50 nm and an alloy film (alloy film of Al and Ti) with a film thickness of 500 nm.

Figure 16:
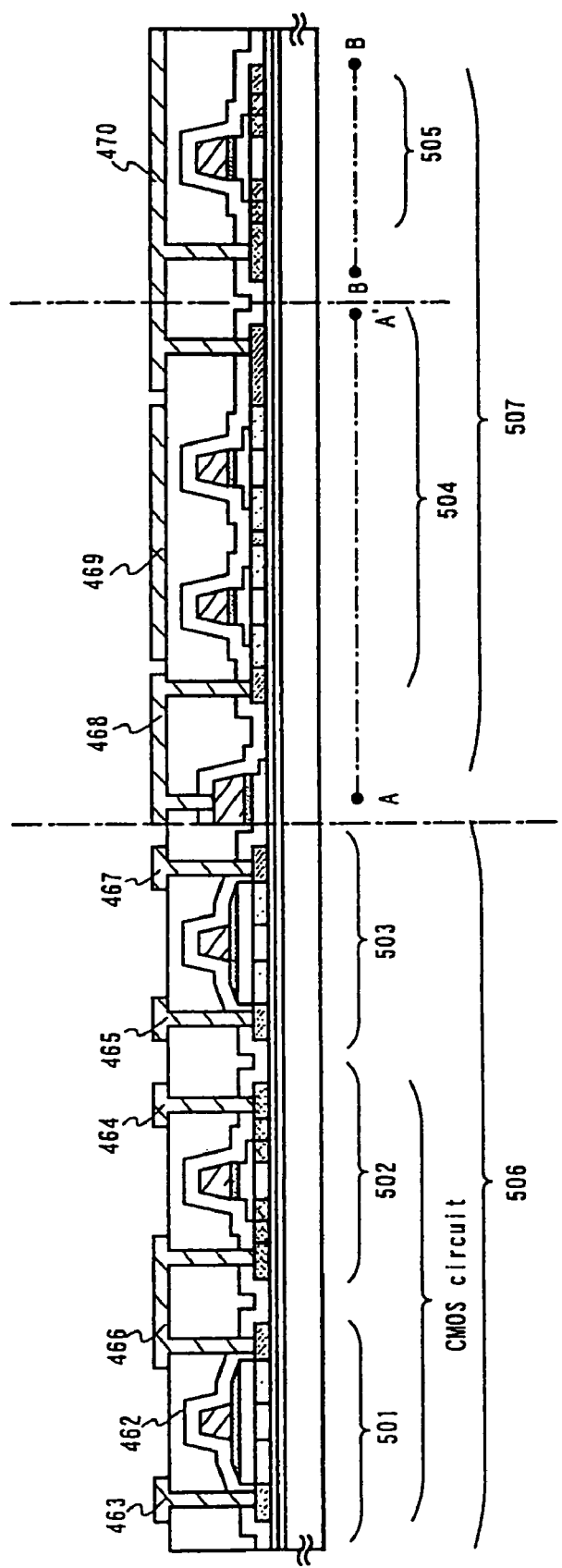
FIG. 16 is a cross-sectional view showing the process of fabricating the pixel TFTs and the TFTs for driver circuits.

Also, in a pixel portion 507, a pixel electrode 470, a gate wiring 469, and a connection electrode 468 are formed (FIG. 16). By this connection electrode 468, an electrical connection between a source wiring (lamination layer of the impurity region 443b and the first conductive layer 449) and the pixel TFT is formed. Also, an electrical connection between the gate wiring 469 and the gate electrode of the pixel TFT is formed. With respect to the pixel electrode 470, an electrical connection with the drain region 442 of the pixel TFT and an electrical connection with the semiconductor layer 458 which functions as one of electrodes for forming a storage capacitor are formed. It is desired that a material having a high reflectivity, such as a film containing Al or Ag as its main constituent, or a lamination film thereof, is used for the pixel electrode 470.

Thus, the driver circuit 506 having a CMOS circuit formed by an n-channel TFT 501 and a p-channel TFT 502 and an n-channel type TFT 503, and the pixel portion 507 having a pixel TFT 504 and a retaining capacitor 505 can be formed on the same substrate. As a result, the active matrix substrate is completed.

The n-channel type TFT 501 of the driver circuit 506 has a channel forming region 423c, a low concentration impurity region (GOLD region) 423b overlapping with the first conductive layer 428a constituting a portion of the gate electrode, and a high concentration impurity region 423a which functions as the source region or the drain region. The p-channel type TFT 502 forming the CMOS circuit by connecting with the n-channel type TFT 501 through an electrode 466 has a channel forming region 446d, an impurity region 446b, 446c formed outside the gate electrode, and a high concentration impurity region 446a which functions as the source region or the drain region. The n-channel type TFT 503 has a channel forming region 425c, a low concentration impurity region 425b (GOLD region) overlapping with the first conductive layer 430a comprising a part of the gate electrode, and a high concentration impurity region 425a which functions as the source region or the drain region.

The pixel TFT 504 of the pixel portion includes a channel forming region 426c, a low concentration impurity region 426b (LDD region) formed outside the gate electrode, and the high concentration impurity region 426a functioning as a source region or a drain region. Besides, impurity elements imparting p-type conductivity are added to the respective semiconductor layers 447a, 447b functioning as one of the electrodes of the storage capacitor 505. The storage capacitor 505 is formed from the electrode (a lamination of 438a and 438b) and the semiconductor layers 447a to 447c using the insulating film 444 as a dielectric member.

Further, in the pixel structure of this embodiment, an end portion of the pixel electrode is formed by arranging it so as to overlap with the source wiring so that the gap between the pixel electrodes is shielded from light without using a black matrix.

Figure 17:
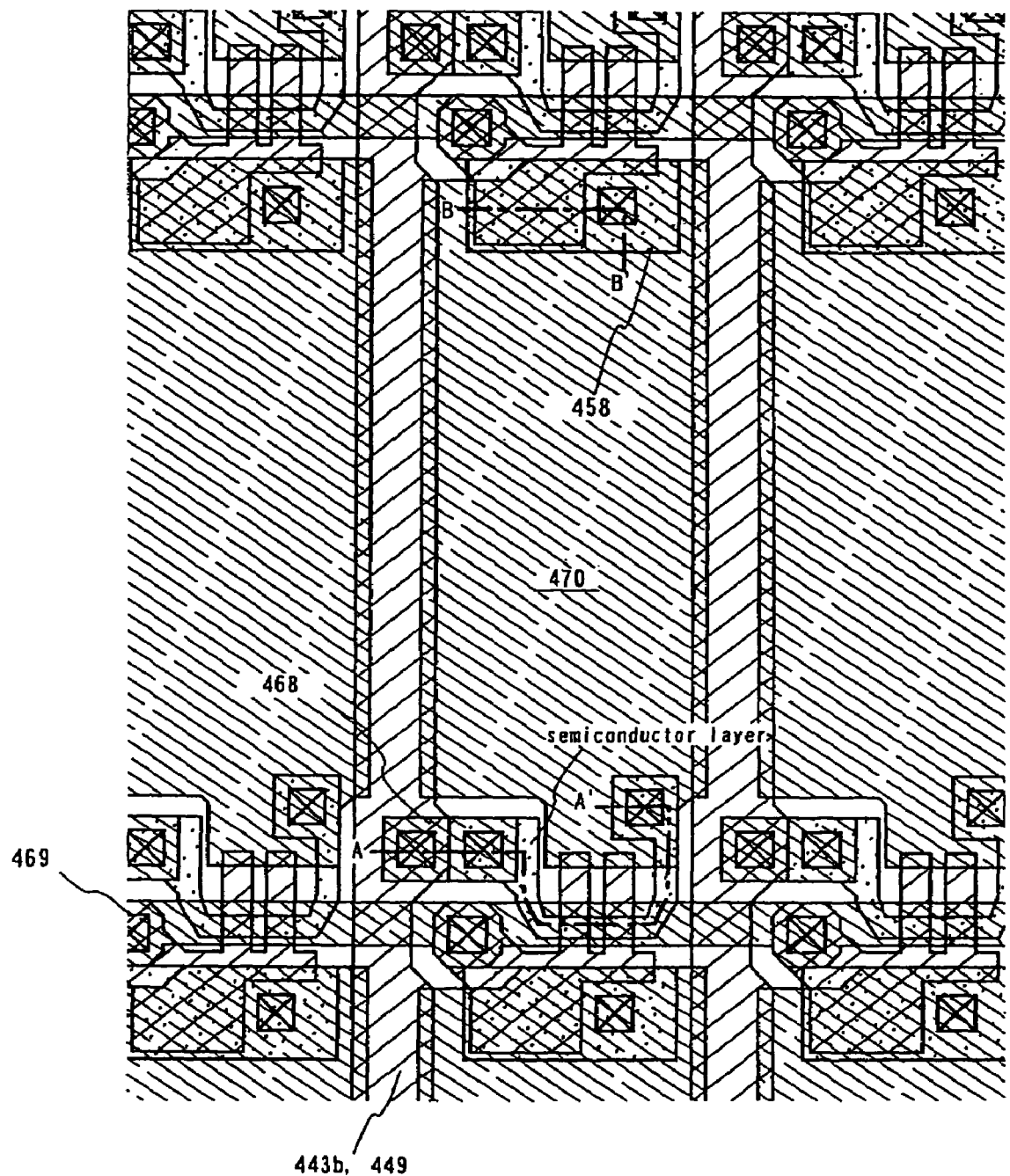
FIG. 17 is a top plan view showing the construction of a pixel TFT.

A top view of the pixel portion of the active matrix substrate manufactured in this embodiment is shown in FIG. 17. Note that, the same reference numerals are used to indicate parts corresponding FIGS. 13 to 16. A dash line A-A' in FIG. 16 corresponds to a sectional view taken along the line A-A' in FIG. 17. Also, a dash line B-B' in FIG. 16 corresponds to a sectional view taken along the line B-B' in FIG. 17.

Thus formed active matrix substrate has a TFT which is formed by using the semiconductor film conducted homogeneous annealing. Therefore, enough operating characteristics and reliability of the active matrix substrate can be obtained.

This embodiment can be performed by freely combining with Embodiments 1 to 2.

Embodiment 4

Figure 18:
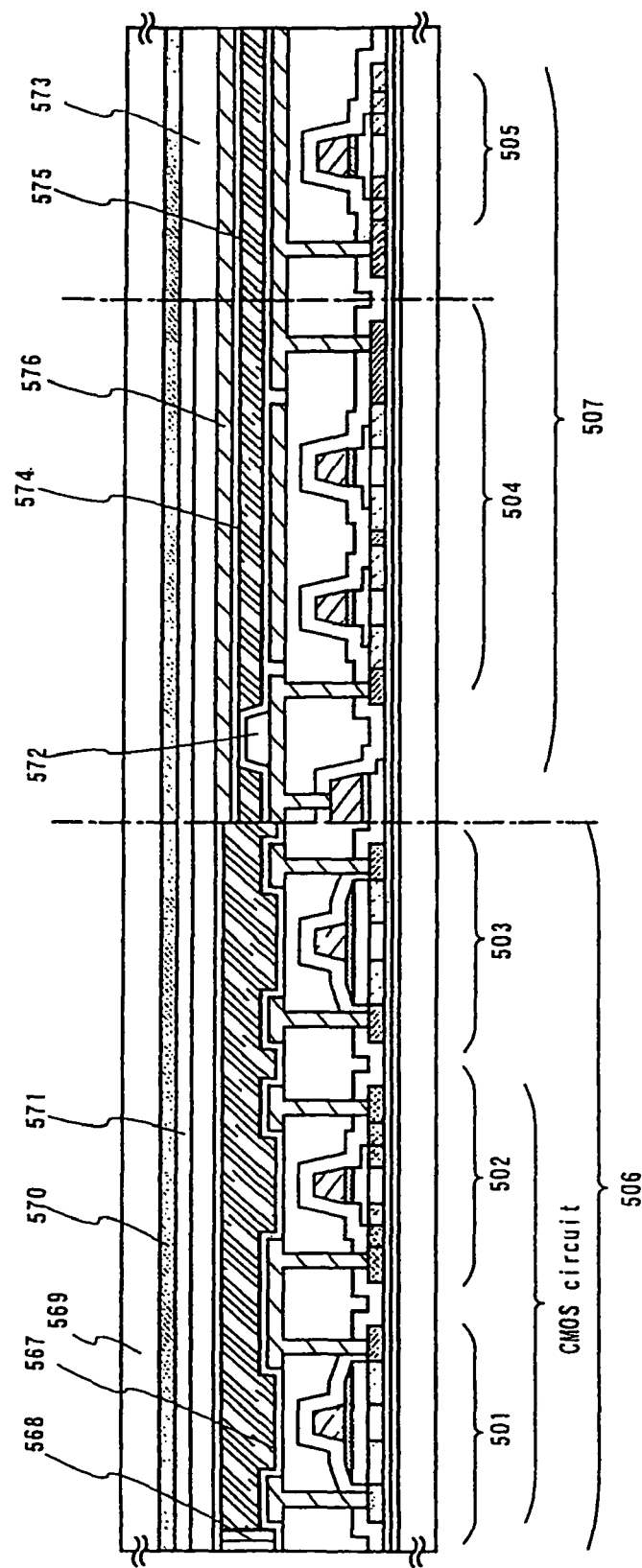
FIG. 18 is a cross-sectional view showing the process of fabricating an active matrix type liquid crystal display device.

In this embodiment, a manufacturing process of a reflection type liquid crystal display device from the active matrix substrate manufactured in accordance with Embodiment 3 will be described hereinbelow. FIG. 18 is used for an explanation thereof.

First, in accordance with Embodiment 3, an active matrix substrate in a state shown in FIG. 17 is obtained, and thereafter, an alignment film 567 is formed on the active matrix substrate of FIG. 17, at least on the pixel electrode 470, and is subjected to a rubbing process. Note that, in this embodiment, before the formation of the alignment film 567, a spacer 572 for maintaining a gap between the substrates is formed at a desired position by patterning an organic film such as an acrylic resin film. Further, spherical spacers may be scattered on the entire surface of the substrate in place of the columnar like spacer.

Next, an opposing substrate 569 is prepared. The colored layers 570, 571 and a leveling film 573 are formed on the opposing substrate 569. The red-colored layer 570 and the blue-colored layer 572 are partially overlapped with each other, thereby forming a light shielding portion. Note that, the red-colored layer and a green-colored layer are partially overlapped with each other, thereby forming a light shielding portion.

In this embodiment, the substrate shown in Embodiment 3 is used. Accordingly, in FIG. 17 showing a top view of the pixel portion in accordance with Embodiment 3, light shielding must be performed at least gaps between the gate wiring 469 and the pixel electrodes 470, a gap between the gate wiring 469 and the connection electrode 468, and a gap between the connection electrode 468 and the pixel electrode 470. In this embodiment, the opposing substrate and the active matrix substrate are stuck so that the light shielding portions from laminated layer of colored layer each other overlap with the positions which need to be shielded from light.

Like this, without using a black mask, the gaps between the respective pixels are shielded from light by the light shielding portion. As a result, the reduction of the manufacturing steps can be attained.

Next, the opposing electrode 576 from transparent conductive film is formed on the leveling film 573, at least on the pixel portion. The alignment film 574 on the entire surface of the opposing substrate and the rubbing process is performed.

Then, an active matrix substrate on which a pixel portion and a driver circuit are formed is stuck with the opposing substrate by a sealing agent 568. In the sealing agent 568, a filler is mixed, and the two substrates are stuck with each other while keeping a uniform gap by the effect of this filler and the columnar spacer. Thereafter, a liquid crystal material 575 is injected between both the substrates to encapsulate the substrates completely by an encapsulant (not illustrated). A known liquid crystal material may be used as the liquid crystal material 575. Thus, the reflection type liquid crystal display device shown in FIG. 18 is completed. Then, if necessary, the active matrix substrate or the opposing substrate may be parted into desired shapes. Further, a polarizing plate is adhered to only the opposing substrate (not illustrated). Then, an FPC is adhered using a known technique.

Thus formed liquid crystal display device have a TFT which is formed by using the semiconductor film conducted homogeneous annealing. Therefore, enough operating characteristics and reliability of the above-mentioned liquid crystal display device can be obtained. Such liquid crystal display device can be used as a display portion of various electronic device.

This embodiment can be combined with Embodiments 1 and 3 freely.

Embodiment 5

In this embodiment, the example of manufacturing the light-emitting device by using manufacturing method of TFT when forming the active matrix substrate shown in Embodiment 3 is described. In this specification, the light-emitting device is a generic name which is a display panel enclosing the light-emitting element between the substrate and the cover material and the display module mounted mounting an IC on the display panel. The light-emitting element has a light-emitting layer containing an organic compound material which can obtain the electro luminescence generated by adding the electric field, the anode layer and the cathode layer. Further, in the luminescence in an organic compound, the luminescence (fluorescence light) when returning from the state of singlet exciton to the basic state and the luminescence (phosphorus light) when returning from the state of triplet exciton to the basic state. Either or both luminescence are contained.

Further, in this embodiment, the organic light-emitting layer is defined all layers formed between the anode and the cathode. The organic light-emitting layer is specifically including the light-emitting layer, the hole injection layer, the electron injection layer, the hole transport layer and the electron transport layer. Basically, the light-emitting element have a structure which is constructed by the anode layer, the light-emitting layer and the cathode layer sequentially. Additionally, the light-emitting layer may have following two structures. The first structure is constructed sequentially by the anode layer, the hole injection layer, the light-emitting layer and the cathode layer. The second structure is sequentially constructed by the anode layer, the hole injection layer, the light-emitting layer, the electron injection layer and the cathode layer.

Figure 19:
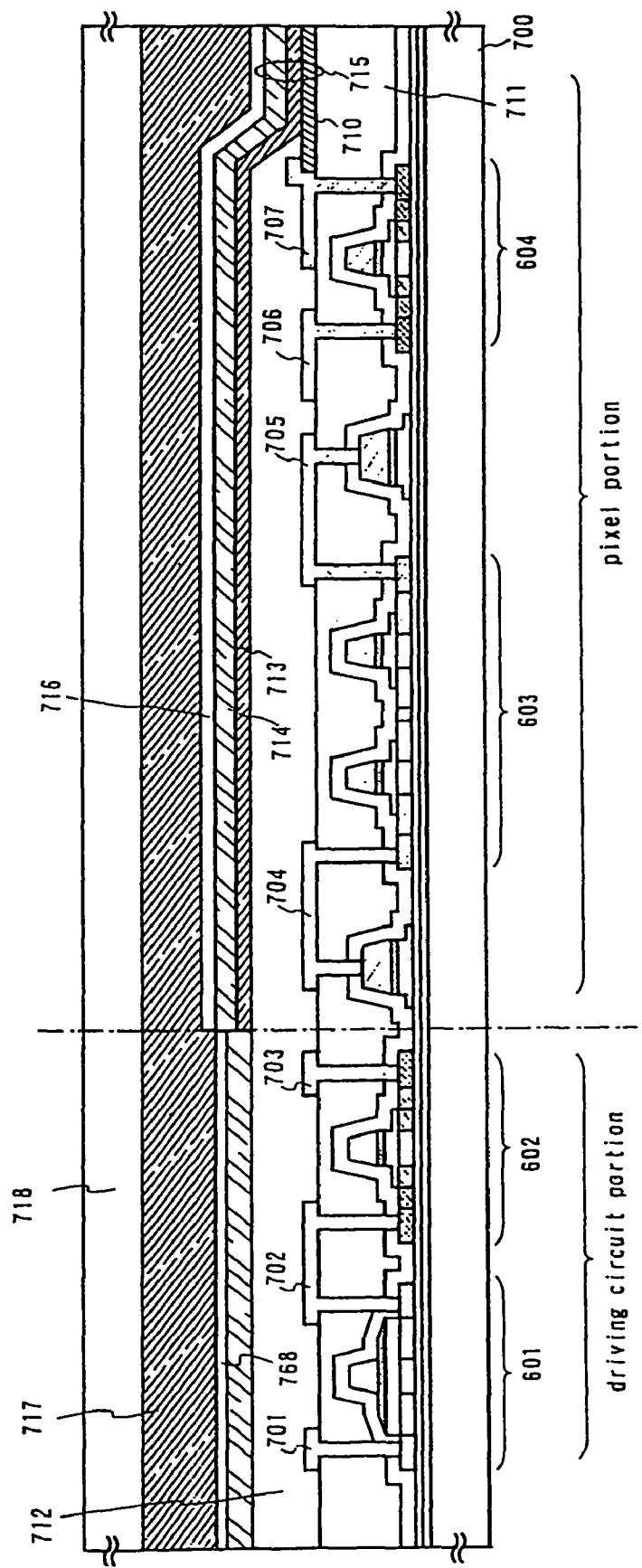
FIG. 19 is a view of a cross-sectional structure of a driver circuit and a pixel section of a light-emitting device.

FIG. 19 is a cross-sectional view of the light-emitting device of the present invention. In FIG. 19, a switching TFT 603 provided on a substrate 700 is formed using the n-channel type TFT 503 of FIG. 19. Thus, this structure may be referred to the description of the n-channel type TFT 503.

Note that, in this embodiment, a double gate structure in which two channel forming regions are formed is used. However, a single gate structure in which one channel forming region is formed, or a triple gate structure in which three channel forming regions are formed may be used.

A driver circuit provided on the substrate 700 is formed using the CMOS circuit of FIG. 19. Thus, this structure may be referred to the descriptions of the n-channel type TFT 501 and the p-channel type TFT 502. Note that, in this embodiment, the single gate structure is used. However, the double gate structure or the triple gate structure may also be used.

Also, wirings 701 and 703 function as a source wiring of the CMOS circuit, a wiring 702 functions as a drain wiring thereof. A wiring 704 functions as a wiring for electrically connecting a source wiring 708 with a source region of the switching TFT. A wiring 705 functions as a wiring for electrically connecting a drain wiring 709 with a drain region of the switching TFT.

Note that, a current-controlled TFT 604 is formed using the p-channel type TFT 502 of FIG. 19. Thus, this structure may be referred to the descriptions of the p-channel type TFT 502. Note that, in this embodiment, the single gate structure is used. However, the double gate structure or the triple gate structure may be used.

Also, a wiring 706 is a source wiring (corresponding to a current supply line) of the current-controlled TFT. Reference numeral 707 denotes an electrode which is electrically connected with a pixel electrode 710 by overlapping with the pixel electrode 710 of the current-controlled TFT.

Note that, reference numeral 710 denotes the pixel electrode (anode of a light-emitting element) made from a transparent conductive film. As the transparent conductive film, a compound of indium oxide and tin oxide, a compound of indium oxide and zinc oxide, zinc oxide, tin oxide, or indium oxide can be used. Also, the transparent conductive film to which gallium is added may be used. The pixel electrode 710 is formed on a level interlayer insulating film 711 before the formation of the above wirings. In this embodiment, it is very important to level a step in the TFT using the leveling film 711 made of resin. Since a light-emitting layer formed later is extremely thin, there is the case where insufficient light-emitting occurs due to the step. Thus, in order to form the light-emitting layer as level as possible, it is desired that the step is leveled before the formation of the pixel electrode 710.

After the wirings 701 to 707 are formed, a bank 712 is formed as shown in FIG. 19. The bank 712 may be formed by patterning an insulating film with a thickness of 100 to 400 nm containing silicon or an organic resin film.

Note that, since the bank 712 is an insulating film, it is necessary to pay attention to a dielectric breakdown of an element in the film formation. In this embodiment, a carbon particle or a metal particle is added to the insulating film which is a material of the bank 712 to reduce a resistivity. Thus, an electrostatic occurrence is suppressed. Here, an additional amount of the carbon particle or the metal particle may be controlled such that the resistivity is $1 \times 10^6$ to $1 \times 10^{12}$ $\Omega$m (preferably, $1 \times 10^8$ to $1 \times 10^{10}$ $\Omega$m).

An EL layer 713 is formed on the pixel electrode 710. Note that, only one pixel is shown in FIG. 19. However, in this embodiment, the light-emitting layers are formed corresponding to respective colors of R (red), G (green), and B (blue). Also, in this embodiment, a low molecular organic light-emitting material is formed by an evaporation method. Concretely, copper phthalocyanine (CuPc) film with a thickness of 20 nm is provided as a hole injection layer, and a tris-8-quinolinolate aluminum complex ($Alq_3$) film with a thickness of 70 nm is provided thereon as a light-emitting layer. Thus, a lamination structure of those films is formed. A light-emitting color can be controlled by adding a fluorochrome such as quinacridon, perylene, or DCM1 to $Alq_3$.

Note that, the above example is one example of the organic light-emitting material which can be used as the light-emitting layer, and it is unnecessary to be limited to this example. The light-emitting layer (layer for causing light to emit and a carrier to move for the emitting of light) may be formed by freely combining the light-emitting layer and a charge transport layer or a charge injection layer. For example, in this embodiment, although the example that the low molecular organic light-emitting material is used as the light-emitting layer is shown, a polymer organic light-emitting material may be also used. Also, an inorganic material such as silicon carbide can be used as the charge transport layer or the charge injection layer. A known material can be used as the organic light-emitting material and the inorganic material.

Next, a cathode 714 made from a conductive film is provided on the light-emitting layer 713. In the case of this embodiment, an alloy film of aluminum and lithium is used as the conductive film. Of course, a known MgAg film (alloy film of magnesium and silver) may be used. As a cathode material, the conductive film made of an element which belongs to group 1 or group 2 of the periodic table, or the conductive film to which those elements are added may be used.

When this cathode 714 is formed, a light-emitting element 715 is completed. Note that, the light-emitting element 715 completed here represents a diode formed by the pixel electrode (anode) 710, the light-emitting layer 713, and the cathode 714.

It is effective to provide a passivation film 716 so as to completely cover the light-emitting element 715. As the passivation film 716, a single layer of an insulating film containing a carbon film, a silicon nitride film, or silicon oxynitride film, or a lamination layer of a combination with the insulating film is used.

Here, it is preferred that a film with a good coverage is used as the passivation film, and it is effective to use the carbon film, in particular a DLC (diamond like carbon) film. Since the DLC film can be formed in a range of a room temperature to 100° C., it can be easily formed over the light-emitting layer 713 with a low heat-resistance. Also, since the DLC film has a high blocking effect against oxygen, the oxidation of the light-emitting layer 713 can be suppressed. Thus, the oxidation of the light-emitting layer 713 during the following sealing process can be prevented.

Further, a sealing member 717 is provided on the passivation film 716, and then a cover member 718 is adhered to the sealing member 717. Ultraviolet light cured resin may be used as the sealing member 717, and it is effective to provide a material having a hygroscopic effect or a material having an oxidation inhibition effect inside. Also, in this embodiment, a member in which a carbon film (preferably, a diamond carbon like film) is formed on both surfaces of, a glass substrate, a quartz substrate, or a plastic substrate (including a plastic film) is used as the cover member 718.

Thus, a light-emitting device of the structure as shown in FIG. 19 is completed. Note that, after the formation of the bank 712, it is effective to successively perform the processes until the formation of the passivation film 716 using a film formation apparatus of a multi chamber system (or an inline system) without exposing to air. Further, processes until the adhesion of the cover member 718 can be successively performed without exposing to air.

Thus, n-channel TFTs 601 and 602, a switching TFT (n-channel TFT) 603, and a current control TFT (n-channel TFT) 604 are formed on the insulator 501 in which a plastic substrate is formed as a base. The number of masks required in the manufacturing process until now is less than that required in a general active matrix light-emitting device.

That is, the manufacturing process of the TFTs is largely simplified, and thus the improvement of yield and the reduction of a manufacturing cost can be realized.

Further, as described using FIG. 19, when the impurity regions overlapped with the gate electrode through the insulating film are provided, the n-channel type TFT having a high resistant against the deterioration due to a hot carrier effect can be formed. Thus, the light-emitting device with high reliability can be realized.

In this embodiment, only the structures of the pixel portion and the driver circuit are shown. However, according to the manufacturing process of this embodiment, logic circuits such as a signal separation circuit, a D/A converter, an operational amplifier, and a γ-correction circuit can be further formed on the same insulator. A memory and a microprocessor can be also formed.

A light-emitting device of this embodiment after the sealing (filling) process for protecting the light-emitting element will be described using FIGS. 20A and 20B. Note that, if necessary, reference symbols used in FIG. 19 are referred to.

Figure 20A:
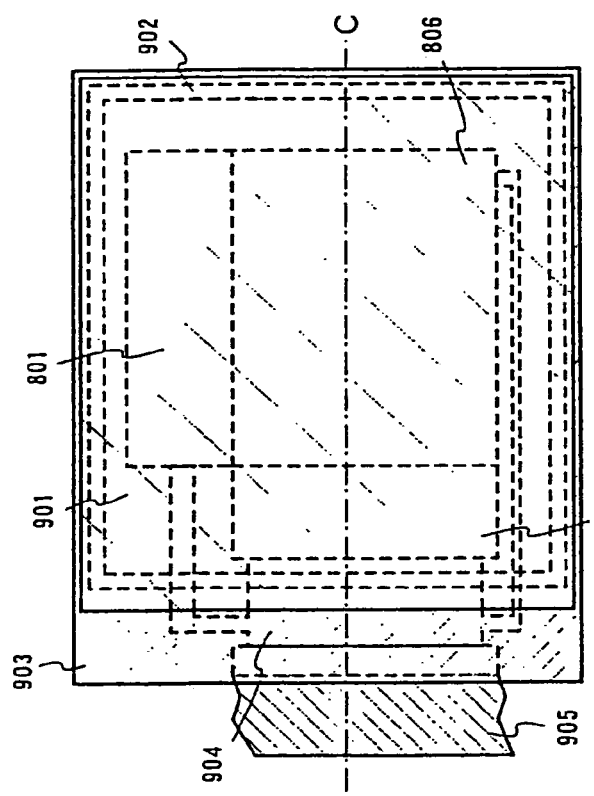
FIG. 20A is a top plan view of the light-emitting device.
Figure 20B:
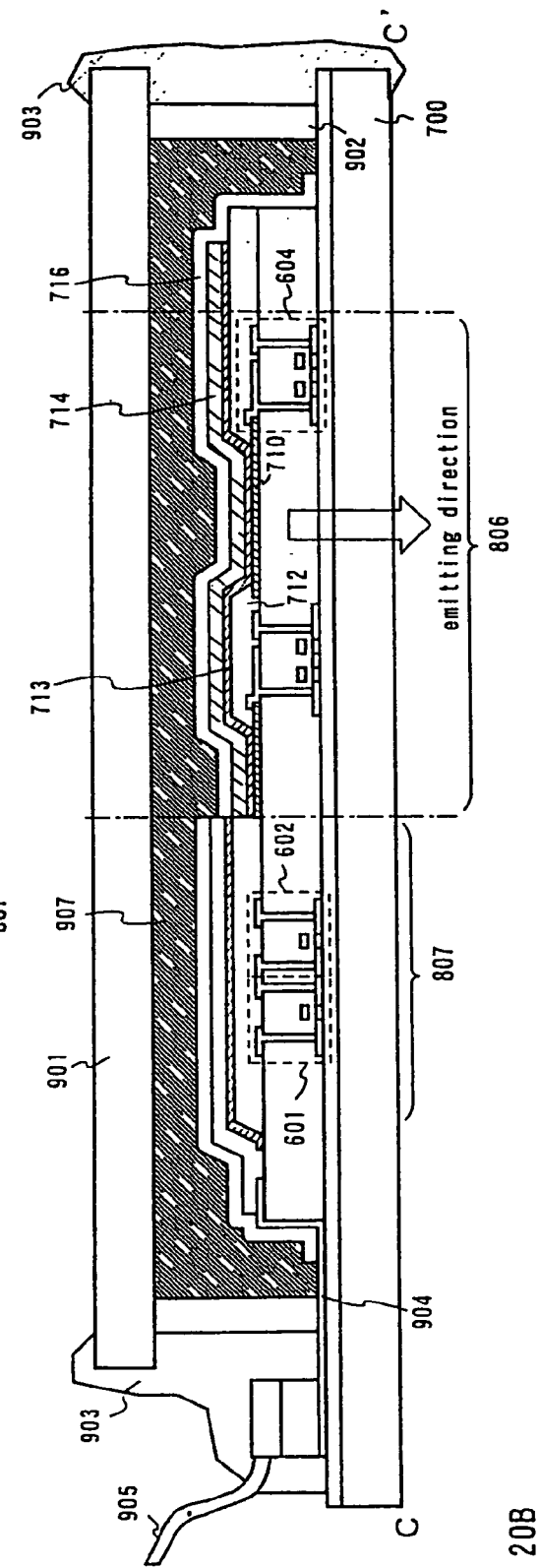
FIG. 20B is a view of a cross-sectional structure of a driver circuit and a pixel section of the light-emitting device.

FIG. 20A is a top view representing the state after the sealing of the EL element, and FIG. 20B is a cross sectional view along a line A-A' of FIG. 20A. Reference numeral 801 shown by a dotted line denotes a source side driver circuit, reference numeral 806 denotes a pixel portion, and reference numeral 807 denotes a gate side driver circuit. Also, reference numeral 901 denotes a cover member, reference numeral 902 denotes a first sealing member, and reference numeral 903 denotes a second sealing member. A sealing member 907 is provided in the inside surrounded by the first sealing member 902.

Note that, reference numeral 904 denotes a wiring for transmitting signals inputted to the source side driver circuit 801 and the gate side driver circuit 807. The wiring 904 receives a video signal and a clock signal from an FPC (flexible printed circuit) 905 as an external input terminal. In FIG. 20A, although only the FPC is shown, a printed wiring board (PWB) may be attached to the FPC. The light-emitting device in this specification includes not only the main body of the light-emitting device but also the light-emitting device to which the FPC or the PWB is attached.

Next, the cross-sectional structure will be described using FIG. 20B. The pixel portion 806 and the gate side driver circuit 807 are formed over a substrate 700. The pixel portion 806 is formed by a plurality of pixels each having a current control TFT 604 and a pixel electrode 710 electrically connected with the drain region thereof. Also, the gate side driver circuit 807 is formed using the CMOS circuit in which an n-channel type TFT 601 and a p-channel type TFT 602 are combined with each other (see FIG. 14).

The pixel electrode 710 functions as an anode of the light-emitting element. Also, banks 712 are formed in both ends of the pixel electrode 710. A light-emitting layer 713 and a cathode 714 of the light-emitting element are formed on the pixel electrode 710.

The cathode 714 also functions as a wiring common to all pixels, and is electrically connected with the FPC 905 through the connection wiring 904. Further, all elements which are included in the pixel portion 806 and the gate side driver circuit 807 are covered with the cathode 714 and a passivation film 716.

Also, the cover member 901 is adhered to the resultant substrate 700 by the first sealing member 902. Note that, in order to keep an interval between the cover member 901 and the light-emitting element, a spacer made of a resin film may be provided. Then, the inside of the first sealing member 902 is filled with a sealing member 907. Note that, it is preferred that epoxy resin is used as the first sealing member 902 and the sealing member 907. Also, it is desired that the first sealing member 902 is a material to which moisture and oxygen are not penetrated as much as possible. Further, a material having a hygroscopic effect or a material having an oxidation inhibition effect may be contained in the sealing member 907.

The sealing member 907 provided to cover the light-emitting element also functions as an adhesive for adhering the cover member 901 to the resultant substrate 700. Also, in this embodiment, FRP (fiberglass-reinforced plastics), PVF (polyvinylfluoride), Mylar, polyester, or acrylic can be used as a material of a plastic substrate 901a composing the cover member 901.

Also, after the adhering of the cover member 901 using the sealing member 907, the second sealing member 903 is provided to cover side surfaces (exposed surfaces) of the sealing member 907. In the second sealing member 903, the same material as that of the first sealing member 902 can be used.

By sealing the light-emitting element with the sealing member 907 with the above structure, the light-emitting element can be completely shielded from the outside, and penetration of a substance (such as moisture or oxygen) which prompts deterioration due to oxidation of the light-emitting layer, from the outside, can be prevented. Thus, the light-emitting display with high reliability is obtained.

Thus formed light-emitting device have a TFT which is formed by using the semiconductor film conducted homogeneous annealing. Therefore, enough operating characteristics and reliability of the above-mentioned light-emitting device can be obtained. Such light-emitting device can be used as a display portion of various electronic devices.

This embodiment can be performed by freely combining with Embodiments 1 to 3.

Embodiment 6

Various semiconductor devices (active matrix type liquid crystal display device, active matrix type light-emitting device or active matrix type EC display device) can be formed by applying the present invention. Specifically, the present invention can be embodied in electronic equipment of any type in which such an electrooptical device is incorporated in a display portion.

Such electronic equipment is a video camera, a digital camera, a projector, a head-mounted display (goggle type display), a car navigation system, a car stereo, a personal computer, or a mobile information terminal (such as a mobile computer, a mobile telephone or an electronic book). FIGS. 21A-21F, 22A-22D, and 23A-23C show one of its examples.

Figure 21A:
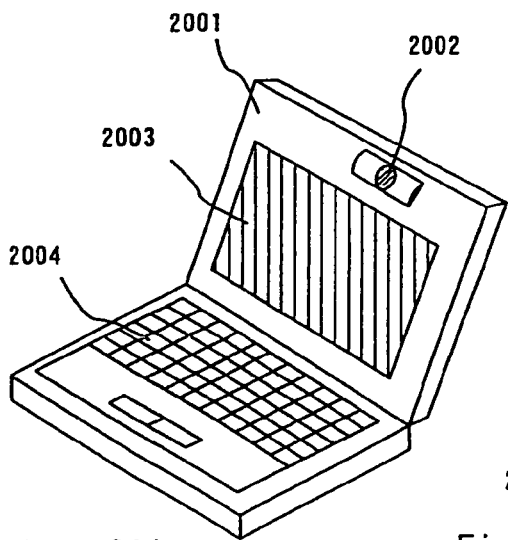
FIGS. 21A to 21F are views showing different examples of a semiconductor device according to the invention.

FIG. 21A shows a personal computer which includes a body 2001, an image input portion 2002, a display portion 2003, a keyboard 2004 and the like. The invention can be applied to the display portion 2003.

Figure 21B:
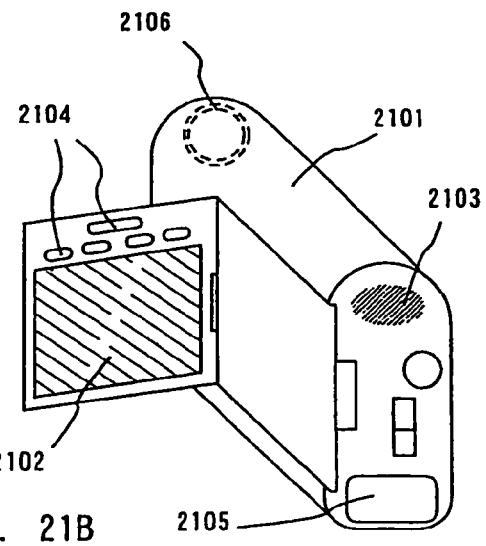

FIG. 21B shows a video camera which includes a body 2101, a display portion 2102, a sound input portion 2103, operating switches 2104, a battery 2105, an image receiving portion 2106 and the like. The invention can be applied to the display portion 2102.

Figure 21C:
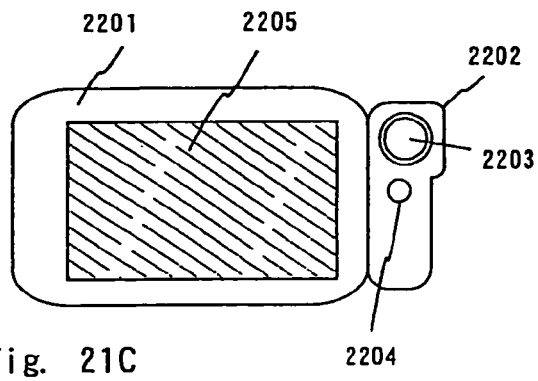

FIG. 21C shows a mobile computer which includes a body 2201, a camera portion 2202, an image receiving portion 2203, an operating switch 2204, a display portion 2205 and the like. The invention can be applied to the display portion 2205.

Figure 21D:
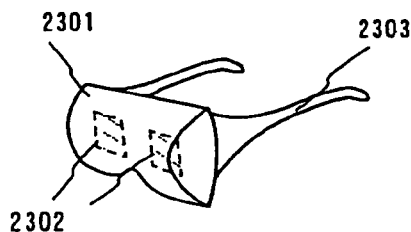

FIG. 21D shows a goggle type display which includes a body 2301, a display portion 2302, arm portions 2303 and the like. The invention can be applied to the display portion 2302.

Figure 21E:
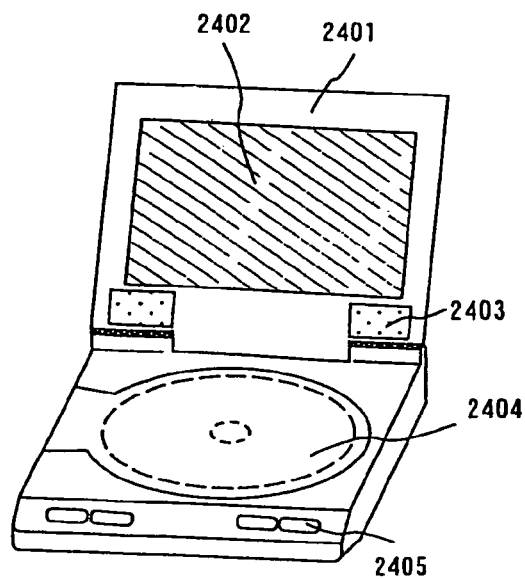

FIG. 21E shows a player using a recording medium on which a program is recorded (hereinafter referred to as the recording medium), and the player includes a body 2401, a display portion 2402, speaker portions 2403, a recording medium 2404, operating switches 2405 and the like. This player uses a DVD (Digital Versatile Disc), a CD and the like as the recording medium, and enables a user to enjoy music, movies, games and the Internet. The invention can be applied to the display portion 2402.

Figure 21F:
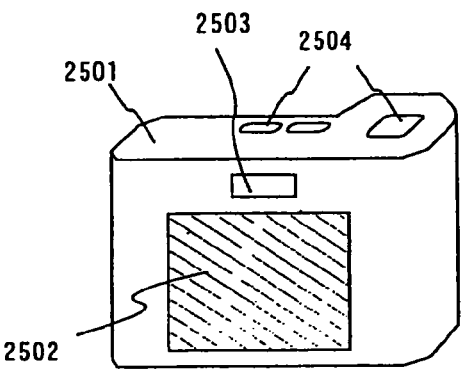

FIG. 21F shows a digital camera which includes a body 2501, a display portion 2502, an eyepiece portion 2503, operating switches 2504, an image receiving portion (not shown) and the like. The invention can be applied to the display portion 2502.

Figure 22A:
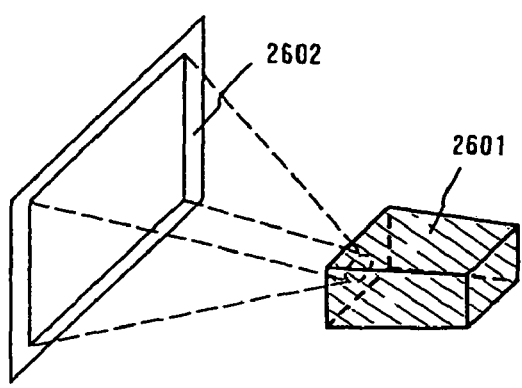
FIGS. 22A to 22D are views showing different examples of the semiconductor device.

FIG. 22A shows a front type projector which includes a projection device 2601, a screen 2602 and the like. The invention can be applied to a liquid crystal display device 2808 which constitutes a part of the projection device 2601 as well as other driver circuits.

Figure 22B:
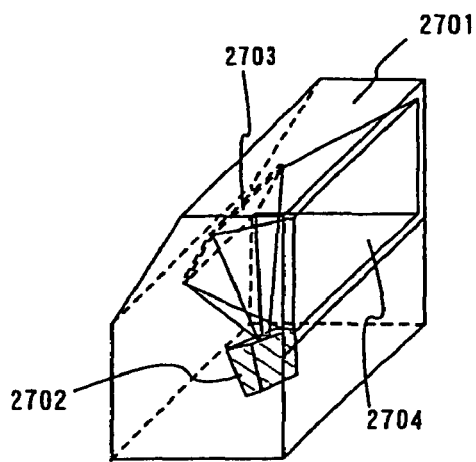

FIG. 22B shows a rear type projector which includes a body 2701, a projection device 2702, a mirror 2703, a screen 2704 and the like. The invention can be applied to the liquid crystal display device 2808 which constitutes a part of the projection device 2702 as well as other driver circuits.

Figure 22C:
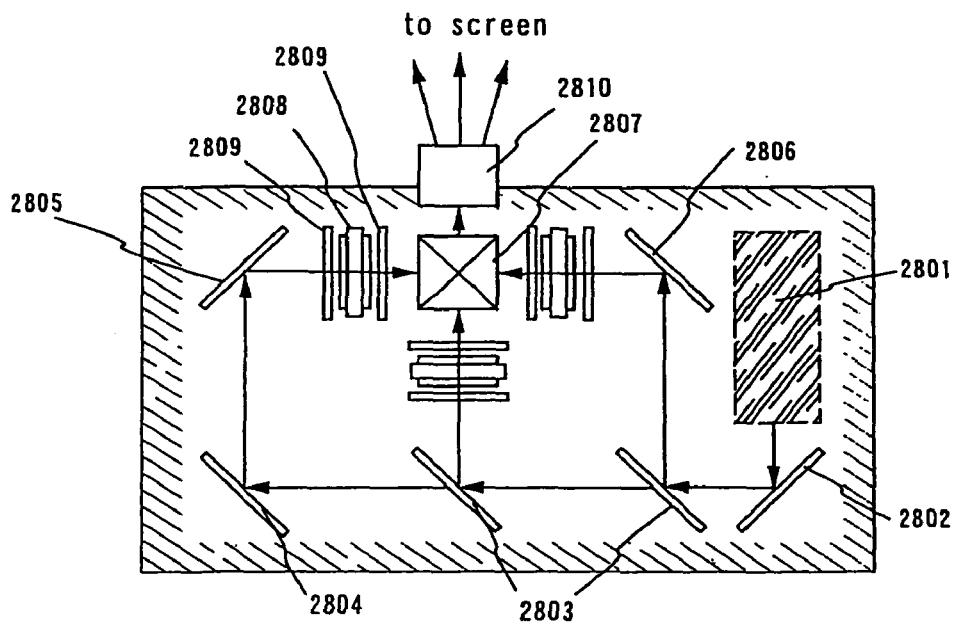

FIG. 22C shows one example of the structure of each of the projection devices 2601 and 2702 which are respectively shown in FIGS. 22A and 22B. Each of the projection devices 2601 and 2702 is made of a light source optical system 2801, minors 2802 and 2804-2806, a dichroic mirror 2803, a prism 2807, a liquid crystal display device 2808, a phase difference plate 2809 and a projection optical system 2810. The projection optical system 2810 is made of an optical system including a projection lens. Embodiment 6 is an example of a three-plate type, but it is not limited to this example and may also be of a single-plate type. In addition, those who embody the invention may appropriately dispose an optical system such as an optical lens, a film having a polarization function, a film for adjusting phase difference or an IR film in the path indicated by arrows in FIG. 22C.

Figure 22D:
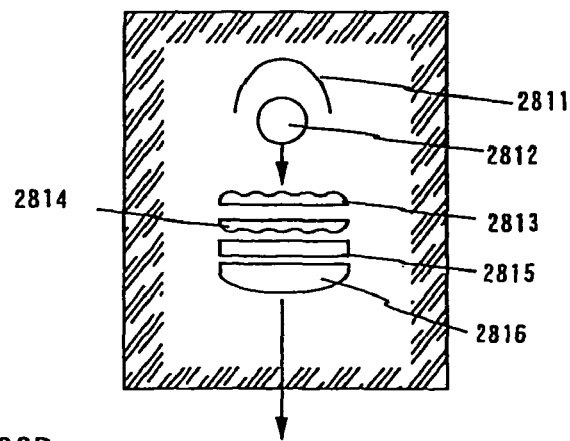

FIG. 22D is a view showing one example of the structure of the light source optical system 2801 shown in FIG. 22C. In Embodiment 6, the light source optical system 2801 is made of a reflector 2811, a light source 2812, lens arrays 2813 and 2814, a polarizing conversion element 2815 and a condenser lens 2816. Incidentally, the light source optical system shown in FIG. 22D is one example, and the invention is not particularly limited to the shown construction. For example, those whose embody the invention may appropriately dispose an optical system such as an optical lens, a film having a polarization function, a film for adjusting phase difference or an IR film.

The projector shown in FIGS. 22A to 22D is of the type using a transparent type of electrooptical device, but there is not shown an example in which the invention is applied to a reflection type of electrooptical device and a light-emitting device.

Figure 23A:
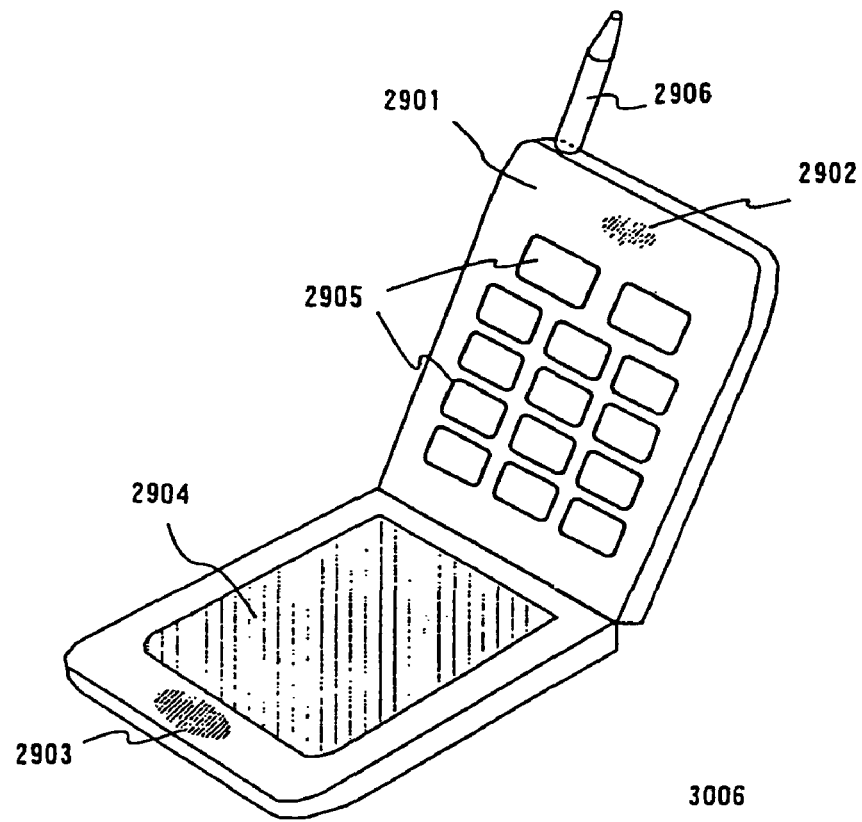
FIGS. 23A to 23C are views showing different examples of the semiconductor device.

FIG. 23A shows a mobile telephone which includes a body 2901, a sound output portion 2902, a sound input portion 2903, a display portion 2904, operating switches 2905, an antenna 2906 and the like. The invention can be applied to the display portion 2904.

Figure 23B:
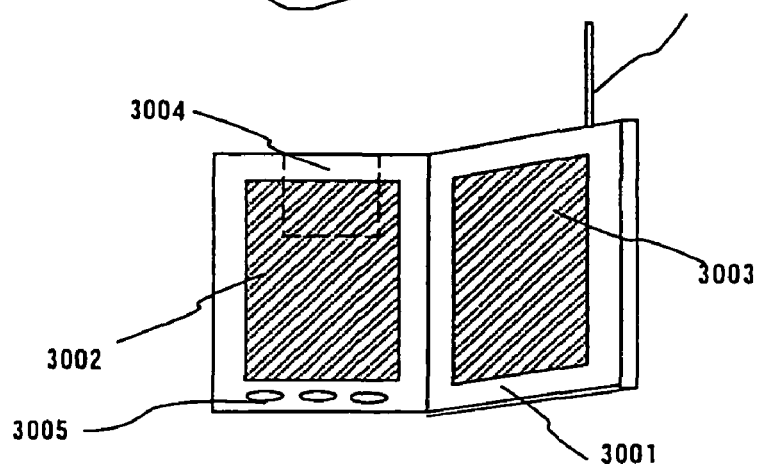

FIG. 23B shows a mobile book (electronic book) which includes body 3001, display portions 3002 and 3003, a storage medium 3004, operating switches 3005, an antenna 3006 and the like. The invention can be applied to the display portions 3002 and 3003.

Figure 23C:
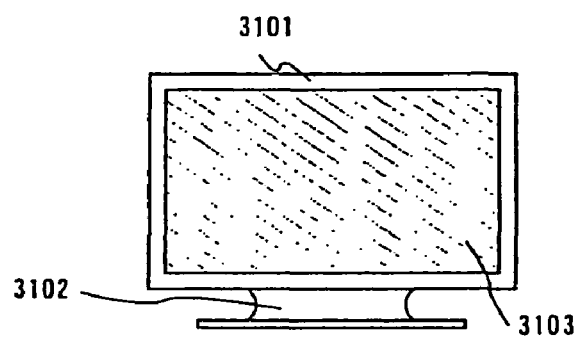

FIG. 23C shows a display which includes a body 3101, a support base 3102, a display portion 3103 and the like. The invention can be applied to the display portion 3103. The invention is particularly advantageous to a large-screen display, and is advantageous to a display having a diagonal size of 10 inches or more (particularly, 30 inches or more).

As is apparent from the foregoing description, the range of applications of the invention is extremely wide, and the invention can be applied to any category of electronic apparatus. Electronic apparatus according to the invention can be realized by using a construction made of a combination of arbitrary ones of Embodiments 1 to 5.

According to the invention, by forming a laser beam into a linear shape during laser annealing, it is possible to improve the throughput of laser annealing, and in addition, by using a solid-state laser which enables easy maintenance, it is possible to achieve a greater improvement in throughput than can be attained with laser annealing using an existing excimer laser. Furthermore, it is possible to reduce the manufacturing costs of semiconductor devices such as TFTs or liquid crystal display devices formed of TFTs.

Moreover, by obliquely irradiating a laser beam onto a semiconductor film, it is possible to remove or reduce a concentric-circle pattern which is formed on the semiconductor film, whereby the properties of the semiconductor films after laser annealing can be made uniform. By fabricating the semiconductor device by using such a semiconductor film, it is possible to improve the performance of the semiconductor device to a great extent.

What is claimed is:

1. A laser irradiation apparatus comprising:
   a substrate stage;
   a substrate over the substrate stage, a semiconductor film being formed over the substrate; and
   a laser oscillator which irradiates the semiconductor film with a laser beam,
   wherein the semiconductor film is irradiated with the laser beam at an incident angle θ, and
   wherein the incident angle θ satisfies $\theta \geq \arctan(w/(14 \times D))$, $(w=(w_1+w_2)/2)$, where $w_1$ indicates a beam width of the laser beam irradiated onto the semiconductor film,
   $w_2$ indicates a beam width of the laser beam at the semiconductor film after reflected by a back surface of the substrate, and
   D indicates a thickness of the substrate.

2. The laser irradiation apparatus according to claim 1, wherein the semiconductor film is crystallized by the laser beam.

3. The laser irradiation apparatus according to claim 1, wherein an energy distribution of the laser beam is uniformed by using long focal length cylindrical lenses at or near an irradiation plane.

4. The laser irradiation apparatus according to claim 1, wherein the laser beam is linear in shape at or near an irradiation plane.

5. The laser irradiation apparatus according to claim 1, wherein the laser beam has a wavelength of 350 nm or more.

6. The laser irradiation apparatus according to claim 1, wherein the laser beam has a wavelength of 400 nm or more.

7. The laser irradiation apparatus according to claim 1, wherein the laser beam is the second harmonic of one kind selected from the group consisting of a YAG laser, a $YVO_4$ laser, a YLF laser, a $YAIO_3$ laser, a ruby laser, an alexandrite layer, a Ti:sapphire layer, and a glass laser.

8. A laser irradiation apparatus comprising:
   a substrate stage;
   a substrate over the substrate stage, a semiconductor film being formed over the substrate;
   a laser oscillator which irradiates the semiconductor film with a laser beam; and
   a mirror configured to adjust a direction of the laser beam,
   wherein the semiconductor film is irradiated with the laser beam at an incident angle θ after reflected by the mirror, and
   wherein the incident angle θ satisfies $\theta \geq \arctan(w/(14 \times D))$, $(w=(w_1+w_2)/2)$, where $w_1$ indicates a beam width of the laser beam irradiated onto the semiconductor film,
   $w_2$ indicates a beam width of the laser beam at the semiconductor film after reflected by a back surface of the substrate, and
   D indicates a thickness of the substrate.

9. The laser irradiation apparatus according to claim 8, wherein the semiconductor film is crystallized by the laser beam.

10. The laser irradiation apparatus according to claim 8, wherein an energy distribution of the laser beam is uniformed by using long focal length cylindrical lenses at or near an irradiation plane.

11. The laser irradiation apparatus according to claim 8, wherein the laser beam is linear in shape at or near an irradiation plane.

12. The laser irradiation apparatus according to claim 8, wherein the laser beam has a wavelength of 350 nm or more.

13. The laser irradiation apparatus according to claim 8, wherein the laser beam has a wavelength of 400 nm or more.

14. The laser irradiation apparatus according to claim 8, wherein the laser beam is the second harmonic of one kind selected from the group consisting of a YAG laser, a $YVO_4$ laser, a YLF laser, a $YAIO_3$ laser, a ruby laser, an alexandrite layer, a Ti:sapphire layer, and a glass laser.

15. A laser irradiation apparatus comprising:
    a substrate stage which is inclined from a horizontal direction;
    a substrate over the substrate stage, a semiconductor film being formed over the substrate; and
    a laser oscillator which irradiates the semiconductor film with a laser beam,
    wherein the semiconductor film is irradiated with the laser beam at an incident angle θ, and
    wherein the incident angle θ satisfies $\theta \geq \arctan(w/(14 \times D))$, $(w=(w_1+w_2)/2)$, where $w_1$ indicates a beam width of the laser beam irradiated onto the semiconductor film,
    $w_2$ indicates a beam width of the laser beam at the semiconductor film after reflected by a back surface of the substrate, and
    D indicates a thickness of the substrate.

16. The laser irradiation apparatus according to claim 15, wherein the semiconductor film is crystallized by the laser beam.

17. The laser irradiation apparatus according to claim 15, wherein an energy distribution of the laser beam is uniformed by using long focal length cylindrical lenses at or near an irradiation plane.

18. The laser irradiation apparatus according to claim 15, wherein the laser beam is linear in shape at or near an irradiation plane.

19. The laser irradiation apparatus according to claim 15, wherein the laser beam has a wavelength of 350 nm or more.

20. The laser irradiation apparatus according to claim 15, wherein the laser beam has a wavelength of 400 nm or more.

21. The laser irradiation apparatus according to claim 15, wherein the laser beam is the second harmonic of one kind selected from the group consisting of a YAG laser, a $YVO_4$ laser, a YLF laser, a $YAIO_3$ laser, a ruby laser, an alexandrite layer, a Ti:sapphire layer, and a glass laser.

22. A laser irradiation apparatus comprising:
    a substrate stage;
    a substrate over the substrate stage, a semiconductor film being formed over the substrate; and
    a laser oscillator which irradiates the semiconductor film with a laser beam,
    wherein the semiconductor film is irradiated with the laser beam at an incident angle θ, and
    wherein the incident angle θ satisfies $\theta \geq \arctan(w/(2 \times D))$, $(w=(w_1+w_2)/2)$, where $w_1$ indicates a beam width of the laser beam irradiated onto the semiconductor film, $w_2$ indicates a beam width of the laser beam at the semiconductor film after reflected by a back surface of the substrate, and D indicates a thickness of the substrate.

23. The laser irradiation apparatus according to claim 22, wherein the semiconductor film is crystallized by the laser beam.

24. The laser irradiation apparatus according to claim 22, wherein an energy distribution of the laser beam is uniformed by using long focal length cylindrical lenses at or near an irradiation plane.

25. The laser irradiation apparatus according to claim 22, wherein the laser beam is linear in shape at or near an irradiation plane.

26. The laser irradiation apparatus according to claim 22, wherein the laser beam has a wavelength of 350 nm or more.

27. The laser irradiation apparatus according to claim 22, wherein the laser beam has a wavelength of 400 nm or more.

28. The laser irradiation apparatus according to claim 22, wherein the laser beam is the second harmonic of one kind selected from the group consisting of a YAG laser, a $YVO_4$ laser, a YLF laser, a $YAlO_3$ laser, a ruby laser, an alexandrite layer, a Ti:sapphire layer, and a glass laser.

29. A laser irradiation apparatus comprising:
a substrate stage;
a substrate over the substrate stage, a semiconductor film being formed over the substrate;
a laser oscillator which irradiates the semiconductor film with a laser beam; and
a mirror configured to adjust a direction of the laser beam,
wherein the semiconductor film is irradiated with the laser beam at an incident angle θ after reflected by the mirror, and
wherein the incident angle θ satisfies $\theta \geq \arctan(w/(2 \times D))$, $(w=(w_1+w_2)/2)$, where $w_1$ indicates a beam width of the laser beam irradiated onto the semiconductor film, $w_2$ indicates a beam width of the laser beam at the semiconductor film after reflected by a back surface of the substrate, and D indicates a thickness of the substrate.

30. The laser irradiation apparatus according to claim 29, wherein the semiconductor film is crystallized by the laser beam.

31. The laser irradiation apparatus according to claim 29, wherein an energy distribution of the laser beam is uniformed by using long focal length cylindrical lenses at or near an irradiation plane.

32. The laser irradiation apparatus according to claim 29, wherein the laser beam is linear in shape at or near an irradiation plane.

33. The laser irradiation apparatus according to claim 29, wherein the laser beam has a wavelength of 350 nm or more.

34. The laser irradiation apparatus according to claim 29, wherein the laser beam has a wavelength of 400 nm or more.

35. The laser irradiation apparatus according to claim 29, wherein the laser beam is the second harmonic of one kind selected from the group consisting of a YAG laser, a $YVO_4$ laser, a YLF laser, a $YAlO_3$ laser, a ruby laser, an alexandrite layer, a Ti:sapphire layer, and a glass laser.

36. A laser irradiation apparatus comprising:
a substrate stage which is inclined from a horizontal direction;
a substrate over the substrate stage, a semiconductor film being formed over the substrate; and
a laser oscillator which irradiates the semiconductor film with a laser beam,
wherein the semiconductor film is irradiated with the laser beam at an incident angle θ, and
wherein the incident angle θ satisfies $\theta \geq \arctan(w/(2 \times D))$, $(w=(w_1+w_2)/2)$, where $w_1$ indicates a beam width of the laser beam irradiated onto the semiconductor film, $w_2$ indicates a beam width of the laser beam at the semiconductor film after reflected by a back surface of the substrate, and D indicates a thickness of the substrate.

37. The laser irradiation apparatus according to claim 36, wherein the semiconductor film is crystallized by the laser beam.

38. The laser irradiation apparatus according to claim 36, wherein an energy distribution of the laser beam is uniformed by using long focal length cylindrical lenses at or near an irradiation plane.

39. The laser irradiation apparatus according to claim 36, wherein the laser beam is linear in shape at or near an irradiation plane.

40. The laser irradiation apparatus according to claim 36, wherein the laser beam has a wavelength of 350 nm or more.

41. The laser irradiation apparatus according to claim 36, wherein the laser beam has a wavelength of 400 nm or more.

42. The laser irradiation apparatus according to claim 36, wherein the laser beam is the second harmonic of one kind selected from the group consisting of a YAG laser, a $YVO_4$ laser, a YLF laser, a $YAlO_3$ laser, a ruby laser, an alexandrite layer, a Ti:sapphire layer, and a glass laser.

* * * * *

UNITED STATES PATENT AND TRADEMARK OFFICE
CERTIFICATE OF CORRECTION

PATENT NO. : 7,872,246 B2
APPLICATION NO. : 12/219649
DATED : January 18, 2011
INVENTOR(S) : Koichiro Tanaka It is certified that error appears in the above-identified patent and that said Letters Patent is hereby corrected as shown below:

At column 8, line 22, "$\therefore \geq \arctan(w/(2\times D))$   (3)" should be -- $\therefore \geq \arctan(w/(2\times D))$   (3)' --;

At column 13, exact line 59, nominally line 61, "13.36 MHz" should be -- 13.56 MHz --;

At column 14, exact line 31, nominally line 32, "self-aliening" should be -- self-aligning --;

At column 24, line 7, "minors 2802" should be -- mirrors 2802 --.

Signed and Sealed this
Twelfth Day of July, 2011

David J. Kappos
*Director of the United States Patent and Trademark Office*